United States Patent
Sharma et al.

(10) Patent No.: US 8,110,254 B1
(45) Date of Patent: Feb. 7, 2012

(54) FLEXIBLE CIRCUIT CHEMISTRY

(75) Inventors: Sunity Sharma, Fremont, CA (US); Jaspreet Singh Dhau, Menlo Park, CA (US)

(73) Assignee: SRI International, Menlo Park, CA (US)

(*) Notice: Subject to any disclaimer, the term of this patent is extended or adjusted under 35 U.S.C. 154(b) by 860 days.

(21) Appl. No.: 11/854,271

(22) Filed: Sep. 12, 2007

Related U.S. Application Data

(60) Provisional application No. 60/999,732, filed on Sep. 12, 2006.

(51) Int. Cl.
*H05K 3/00* (2006.01)
*H05K 3/02* (2006.01)
*G03F 7/16* (2006.01)
*G03F 7/00* (2006.01)

(52) U.S. Cl. ........ 427/555; 427/532; 427/551; 427/552; 427/553; 427/554; 427/299; 427/301; 427/209; 427/98.4; 427/304; 427/58; 427/96.1; 427/126.1; 427/126.5; 427/180; 428/901; 428/356; 428/209

(58) Field of Classification Search .................. 427/98.4
See application file for complete search history.

(56) References Cited

U.S. PATENT DOCUMENTS

| | | | |
|---|---|---|---|
| 3,793,072 A | 2/1974 | Lando | |
| 3,930,963 A | 1/1976 | Polichette et al. | |
| 3,937,857 A | 2/1976 | Brummett et al. | |
| 3,969,554 A | 7/1976 | Zeblisky | |
| 4,451,666 A * | 5/1984 | Sofranko et al. | 560/204 |
| 4,486,466 A | 12/1984 | Leech et al. | |
| 4,715,935 A | 12/1987 | Lovie et al. | |
| 4,873,123 A | 10/1989 | Canestaro et al. | |
| 4,976,990 A | 12/1990 | Bach et al. | |
| 5,021,398 A | 6/1991 | Sharma et al. | |
| 5,179,060 A | 1/1993 | Subramanian et al. | |
| 5,281,447 A | 1/1994 | Brady et al. | |
| 5,464,692 A | 11/1995 | Huber | |
| 5,478,462 A | 12/1995 | Walsh | |
| 5,721,007 A | 2/1998 | Lynch et al. | |
| 5,846,615 A | 12/1998 | Sharma et al. | |
| 5,894,038 A | 4/1999 | Sharma et al. | |
| 5,980,998 A | 11/1999 | Sharma et al. | |
| 6,165,912 A * | 12/2000 | McConnell et al. | 438/758 |
| 6,265,086 B1 | 7/2001 | Harkness | |

(Continued)

FOREIGN PATENT DOCUMENTS

GB 1154152 6/1969

(Continued)

OTHER PUBLICATIONS

Francis et al., Advanced Organic Chemistry: Part A, Springer, (2007).*

(Continued)

*Primary Examiner* — Michael Cleveland
*Assistant Examiner* — Lisha Jiang
(74) *Attorney, Agent, or Firm* — Beyer Law Group LLP

(57) ABSTRACT

The present invention provides a circuit creation technology that improves conductive line manufacture by adding active and elemental palladium onto the surface of a substrate. The palladium is disposed in minute amounts on the surface and does not form a conductive layer by itself, but facilitates subsequent deposition of a metal onto the surface, according to the pattern of the palladium, to form the conductive lines.

14 Claims, 11 Drawing Sheets

U.S. PATENT DOCUMENTS

| | | | |
|---|---|---|---|
| 6,395,332 B1 * | 5/2002 | Hanawa et al. | 427/216 |
| 6,548,122 B1 | 4/2003 | Sharma et al. | |
| 6,663,915 B2 | 12/2003 | Palmans et al. | |
| 6,775,907 B1 | 8/2004 | Boyko et al. | |
| 6,824,666 B2 | 11/2004 | Gandikota et al. | |
| 6,855,378 B1 | 2/2005 | Narang | |
| 6,911,385 B1 | 6/2005 | Haubrich et al. | |
| 6,972,078 B1 | 12/2005 | Tsou et al. | |
| 2005/0238812 A1 | 10/2005 | Bhangale et al. | |

FOREIGN PATENT DOCUMENTS

| | | | |
|---|---|---|---|
| JP | 09064309 A | * | 3/1997 |
| WO | WO96/27691 | | 9/1996 |

OTHER PUBLICATIONS

Thomas et al., "Single-Site Heterogeneous Catalysts", Angewandte Chemie International Edition, vol. 44, Issue 40, (Oct. 14, 2005), pp. 6456-6482.*

Office Action dated Jun. 19, 2009 from U.S. Appl. No. 11/854,274.
Final Office Action dated Jan. 7, 2010 from U.S. Appl. No. 11/854,274.
U.S. Appl. No. 12/142,577, filed Jun. 19, 2008.
Office Action dated Dec. 1, 2009 from U.S. Appl. No. 12/142,577.
Office Action dated Dec. 14, 2009 from U.S. Appl. No. 11/854,277.
Final Office Action dated Apr. 7, 2010 from U.S. Appl. No. 12/142,577.
Final Office Action dated May 18, 2010 from U.S. Appl. No. 11/854,277.
Office Action dated Aug. 6, 2010 from U.S. Appl. No. 12/142,577.
Office Action dated Sep. 9, 2010 from U.S. Appl. No. 11/854,277.
Office Action dated Sep. 10, 2010 from U.S. Appl. No. 11/854,274.
Office Action dated Nov. 10, 2010 from U.S. Appl. No. 12/779,867.

* cited by examiner

FLEXIBLE CIRCUIT CHEMISTRY

CROSS REFERENCE TO RELATED APPLICATIONS

This application claims priority under 35 U.S.C. §119(e) from co-pending U.S. Provisional Application No. 60/999,732, entitled "FLEXIBLE CIRCUIT CHEMISTRY", filed Sep. 12, 2006, and naming S. Sharma et al. as inventors, which is incorporated by reference in its entirety for all purposes.

This invention relates to U.S. patent application Ser. No. 11/854,274 (now U.S. Pat. No. 7,981,508) and U.S. patent application Ser. No. 11/854,277 (now abandoned), both filed on the same day as this patent application, naming S. Sharma et al. as inventors; these applications are incorporated herein by reference in their entirety and for all purposes.

FIELD OF THE INVENTION

This invention relates to precursors used to facilitate the deposition of a metal onto a surface, such as metal used to form conductive lines in a circuit. In particular, the invention relates to printing circuit precursors on a wide variety of substrates including flexible and non-flat substrates.

BACKGROUND OF THE INVENTION

Circuit manufacturers employ numerous techniques to deposit a conductive pattern on a substrate. One technique applies a conductive seed layer to the substrate to facilitate subsequent electro/electroless plating of a metal that forms conductive lines in the conductive pattern. The conductive seed layer alone is insufficient to reliably serve as the conductive lines in a circuit, but uses large amounts of the seed material to maintain conductivity for subsequent metal addition. Another technique uses an adhesive layer to attach a conductive layer to the substrate. The adhesive layer, however, adds thickness to the final circuit, which is undesirable for circuits employed in portable and small form factor applications. Circuit manufacturers have also developed etching processes that apply a photoresist, etch the photoresist to form a pattern, add metal to form conductive lines according to the pattern, along with other process steps such as washes to cleanse byproducts from each stage. These numerous etch steps increase manufacturing complexity, add disposal requirements for etch by-products, lengthen manufacturing time, and the pattern and etch equipment raises capital cost for circuit manufacture. All these downsides burden circuit manufacturers by adding to manufacturing complexity and circuit cost.

Also, most conductive pattern manufacturing processes limit their circuits to rigid substrates. For example, a seed conductive layer needs an inflexible substrate to physically support the continuous seed layer. If the substrate bends, then the continuous and conductive seed lines crack and break, which compromises subsequent metal deposition.

The ability to manufacture a conductive pattern without these undue complexities and limitations would be desirable.

SUMMARY OF THE INVENTION

The present invention improves conductive pattern formation and adds active and elemental palladium onto the surface of a substrate. Active palladium is palladium metal that has two desirable properties: it is catalytic for subsequent addition of a metal onto the palladium, and it is strongly anchored to the underlying substrate. The active palladium is disposed in minute amounts on the surface and does not form a conductive layer by itself, but facilitates subsequent deposition of a metal onto the surface, according to the pattern of the palladium, to form a conductive pattern. The conductive pattern may include one or more conductive lines, or a block deposition of metal according to other shapes that do not resemble lines.

This conductive pattern formation is well suited for use in circuit manufacture, and find wide use to create both existing and new products. For example, the present invention enables and eases printing of conductive lines onto flexible substrates and substrates with custom shapes.

In one embodiment, the active palladium is disposed on the surface by first depositing palladium precursor solution onto the substrate; evaporating solvent from the solution, and then decomposing a palladium precursor (left after the evaporation) to produce active palladium on the substrate surface. The active palladium may or may not be patterned to regulate subsequent deposition of a metal according to the pattern. Active palladium patterning may be accomplished during solution deposition on the surface or during decomposition, for example.

In one aspect, the present invention relates to a method for producing active palladium on a substrate. The method includes depositing a palladium precursor solution onto the substrate; the palladium precursor solution includes a Lewis base ligand and a palladium compound in a solvent. The method also includes exposing the palladium precursor solution to conditions that promote evaporation of the solvent from the palladium precursor solution to leave a palladium precursor on the substrate. The method further includes decomposing the palladium precursor to produce a pattern of active palladium on a surface of the substrate, wherein the active palladium approximately has a zero valence.

In another aspect, the present invention relates to another method for producing active palladium on a substrate. The method includes providing a solution comprising a) a Lewis base ligand and b) a palladium carboxylate having three to five carbon atoms in c) a solvent. A suitable organic solvent may include an aprotic and polar solvent. The method also includes depositing a portion of the palladium precursor solution onto the substrate. The method further includes removing the solvent to leave a palladium precursor on the substrate. The method additionally includes decomposing the palladium precursor to leave active palladium on the substrate.

In yet another aspect, the present invention relates to a circuit precursor that includes a substrate and a pattern of active palladium on a surface of the substrate. The active palladium does not form a conductive layer on the substrate and has a surface concentration of less than about $6 \times 10^{-10}$ gram atoms of palladium per square millimeter.

In still another aspect, the present invention relates to a method for providing a palladium precursor solution for use with a printer. The method comprises adding a Lewis base ligand and a palladium carboxylate to a solvent to create a palladium precursor solution. The method also comprises storing the palladium precursor solution in a printing reservoir for use with the printer, which is configured to transfer the palladium precursor solution from the reservoir onto a substrate.

In another aspect, the present invention relates to a circuit that includes a substrate, a pattern of active palladium on a surface of the substrate, and a set of conductive lines that include a metal and are disposed on the substrate according to the active palladium pattern. The active palladium does not form a conductive layer on the substrate and has a surface concentration of less than about $6\times10^{-10}$ gram atoms of palladium per square millimeter.

In yet another aspect, the present invention relates to a method for producing one or more conductive lines on a substrate. The method includes depositing a palladium precursor solution onto the substrate, wherein the palladium precursor solution includes a Lewis base ligand and a palladium compound in a solvent. The method also includes exposing the palladium precursor solution to conditions that promote evaporation of the solvent to leave a palladium precursor on the substrate. The method further includes decomposing the palladium precursor to leave active palladium on the substrate, wherein the active palladium approximately has a zero valance. The method additionally includes depositing a metal on the substrate according to a pattern of the active palladium on the substrate to form one or more conductive lines.

In still another aspect, the present invention relates to a structure including a substrate, a conductive layer disposed on the substrate, and a layer of active palladium disposed between the substrate and the conductive layer. The active palladium does not form a conductive layer on the substrate without depositing a metal or conductive material layer and has a surface concentration of less than about $6\times10^{-10}$ gram atoms of palladium per square millimeter.

In another aspect, the present invention relates to a method for printing a palladium precursor on a flexible substrate. The method includes printing a palladium precursor solution onto the substrate using a printer. The palladium precursor solution includes a Lewis base ligand and a palladium compound in a solvent. The method also includes exposing the palladium precursor solution to conditions that promote evaporation of the solvent from the palladium precursor solution to leave a palladium precursor on the substrate.

In yet another aspect, the present invention relates to a printing apparatus for printing a circuit or a circuit precursor. The printing apparatus comprises a reservoir configured to contain a palladium precursor solution. The solution includes a solvent, a Lewis base ligand in the solvent, and a palladium carboxylate in the solvent, wherein the palladium carboxylate has six carbon atoms or less. The printing apparatus also comprises a dispensing mechanism configured to transfer the palladium precursor solution from the reservoir to a substrate.

In still another aspect, the present invention relates to a liquid for use with a printer to produce a metal precursor pattern on a substrate. The liquid includes a palladium precursor solution suitable for printing in the printer onto the substrate. The solution includes a solvent, a Lewis base ligand in the solvent, and a palladium carboxylate in the solvent.

In another aspect, the present invention relates to a liquid for use with a printing apparatus to produce a metal precursor pattern on a substrate. The liquid includes a palladium precursor solution suitable for printing in the printing apparatus onto the substrate. The solution includes a solvent, a Lewis base ligand in the solvent, and a palladium carboxylate in the solvent. The palladium precursor solution is adapted to a rheological property of a fluidic dispensing requirement of the printing apparatus.

In yet another aspect, the liquid includes an additive that adjusts a rheological property of the palladium precursor solution to a rheological property of a fluidic dispensing requirement of the printing apparatus These and other features and advantages of the invention will be described in more detail below with reference to the associated figures.

DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Circuit manufacturing methods described herein deposit a metal precursor to a substrate, before adding one or more conductive lines. The metal precursor refers to a metal, typically in elemental form, that catalyzes the deposition of another metal onto a surface. Copper is a common metal that is added to form conductive lines. Numerous established metal plating processes, such as electro/electroless plating, are used in circuit manufacturing to deposit copper onto a surface to form the conductive lines, and benefit from a metal precursor as described herein. High-resolution circuits and circuit boards may be printed in this manner—on flexible substrates and custom shaped surfaces. Metallic and non-metallic substrates may also be used in the circuits, including thermoplastic substrates, thermosetting resins, glass, ceramics, semiconductor materials including silicon, etc.

Active palladium is a metal precursor that works well with many substrates and copper deposition techniques. The active palladium has two desirable properties: (1) it is catalytic for subsequent addition of a metal onto the palladium (such as electroless deposition), and (2) it is strongly anchored to the underlying substrate. In one embodiment, the active palladium approximately has a zero valance. The active palladium is also ideally disposed monoatomically onto the substrate. One of skill in the art will appreciate that elemental palladium does not readily bind to a surface monoatomically or with an approximately zero valance, and needs to be deliberately processed to achieve such a state. Described below are processing techniques to accomplish this.

Figure 1:
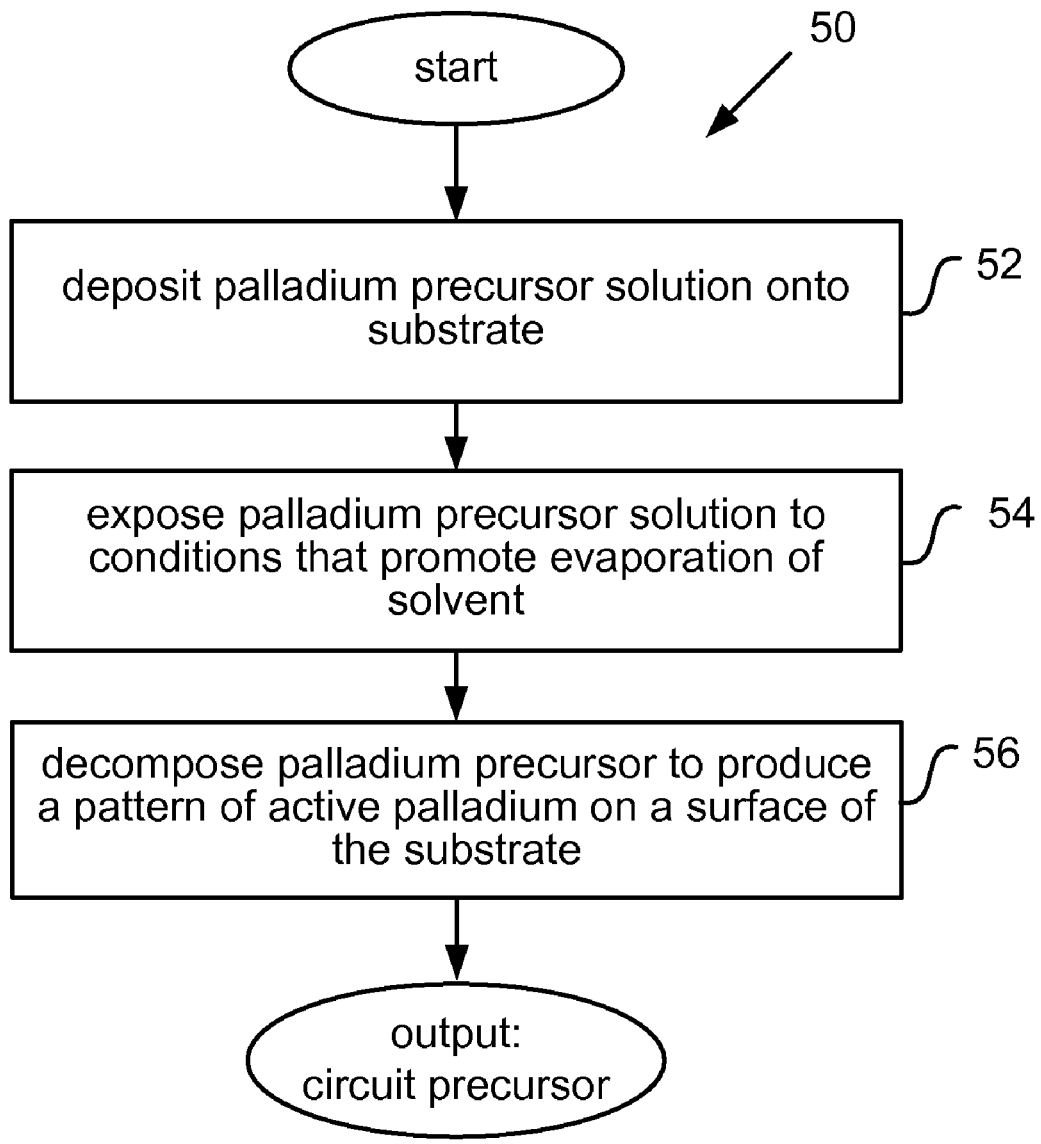
FIG. 1 shows a method for producing active palladium on a substrate in accordance with one embodiment of the present invention.

FIG. 1 shows a method 50 for producing a metal precursor such as active palladium on a substrate in accordance with one embodiment of the present invention. Although the present invention will now be described as a method, those of skill in the art will recognize that description provided for the following steps and method may also apply to one or more apparatus used to implement the methods and/or a device produced by the steps and method.

Figure 2:
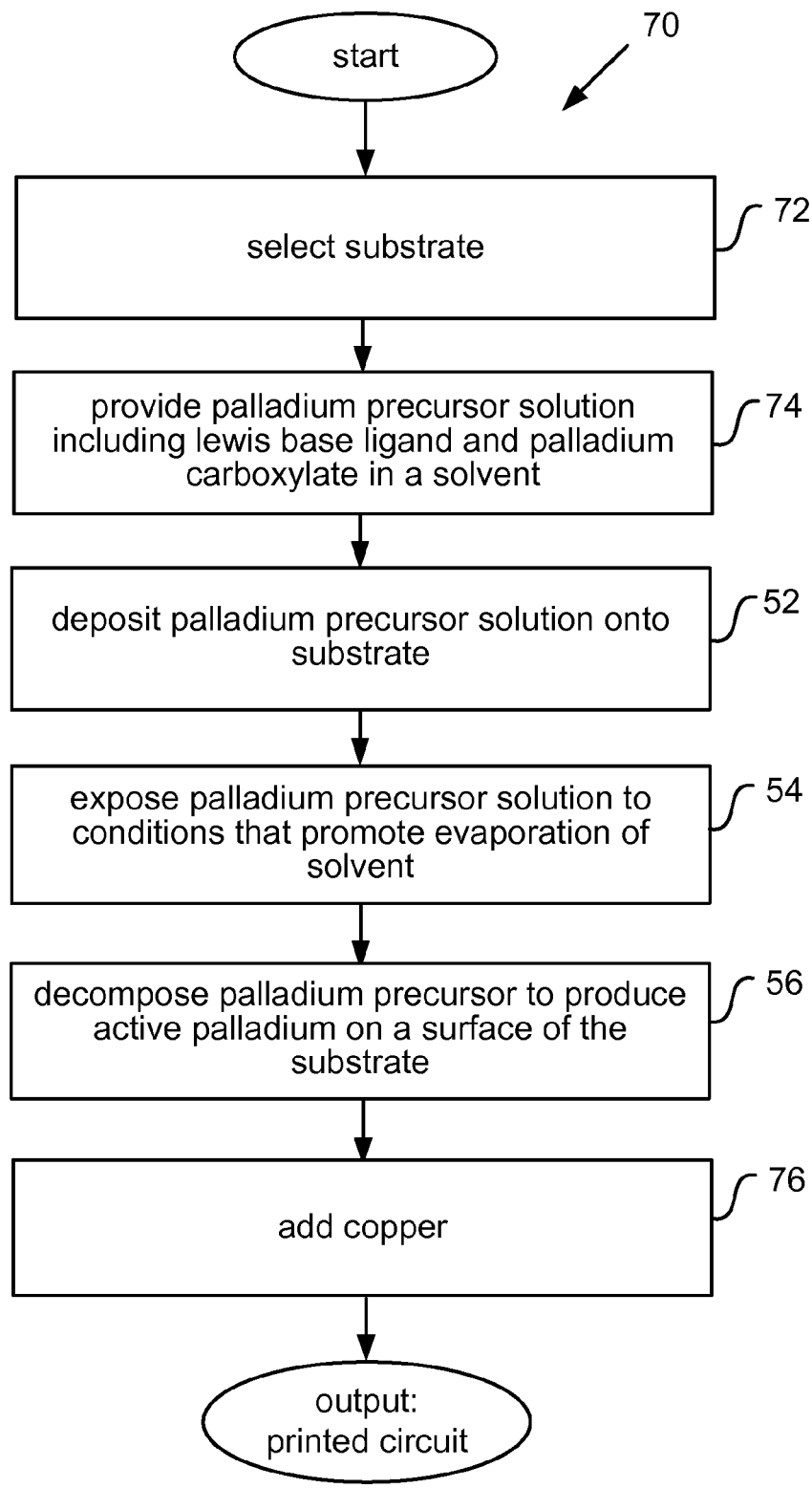
FIG. 2 shows a method for manufacturing a printed circuit on a substrate in accordance with one embodiment of the present invention.
Figure 3:
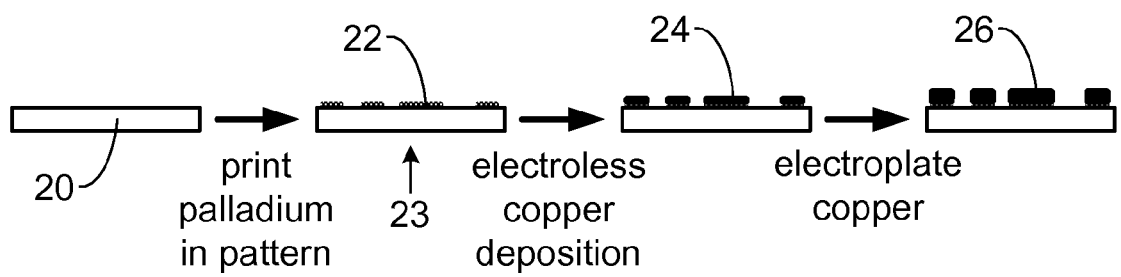
FIG. 3 shows simplified cross sections of exemplary manufactured components obtained using the manufacturing of FIG. 2 in accordance with one embodiment of the present invention.

FIG. 2 shows a method 70 for manufacturing a printed circuit on a substrate in accordance with one embodiment of the present invention, which includes the metal precursor patterning steps 52-56 of FIG. 1 in addition to several steps related to circuit design and manufacture. FIG. 3 shows simplified cross sections of exemplary manufactured components obtained using the manufacturing of FIG. 2 in accordance with one embodiment of the present invention. FIG. 3 depicts an initial substrate 20 having a palladium precursor 22 printed thereupon to form a circuit precursor 23, after which an electroless copper deposition 24 and a further copper electroplating 26 result in a more developed circuit.

Beginning with FIG. 1, metal precursor patterning method 50 begins by depositing a palladium precursor solution onto a substrate 20. In one embodiment, the palladium precursor solution includes a Lewis base ligand and a palladium compound in a solvent. Further description of palladium precursor solutions and chemical constituents included therein are described in further detail below.

The palladium precursor solution is exposed to conditions that promote evaporation of the solvent from the palladium precursor solution, to leave a palladium precursor on the substrate (54). Typically this includes supplying heat to the substrate and/or solution via conduction, convection and/or radiation. For example, a field evaporation using convection is suitable for many printing applications. While the goal of this evaporation step is generally to remove as much as the solvent as possible, it is understood that incomplete solvent evaporation is suitable for many embodiments. In this case, additional heat or energy supplied in the next step may complete the evaporation process.

In one embodiment, evaporation at least partially occurs before the droplets of palladium precursor solution settle on the substrate. In some cases, the method expedites evaporation by pre-heating the palladium precursor solution while it is being deposited on to the substrate. Depending on the substrate, evaporating the solvent before or during decomposition reduces local inaccuracies that may result from the active palladium (which is so reactive that it may bind to the solvent) attaching to the solvent residue.

Method 50 then decomposes the palladium precursor to produce a pattern of active and elemental palladium on a surface of the substrate (56). The decomposition adds energy to the palladium precursor to separate and remove the ligand from the elemental palladium, thereby leaving the elemental palladium on the surface. As will be described in further detail below, the decomposition facilitates the deposition of monoatomic and elemental palladium with approximately zero valence on the substrate. In one embodiment, the decomposition converts the palladium precursor from a palladium cation to active palladium atoms with approximately zero valence on the substrate.

Decomposition and de-ligation may be accomplished in various manners. Generally speaking, the decomposition apparatus provides electromagnetic radiation and energy to the substrate and/or palladium precursor. Suitable energy sources may include thermal sources, light sources such as a laser, infrared and ultraviolet heaters, ion beams, e-beams, microwave sources, and combinations thereof. The radiation source may be coherent or non-coherent. In one embodiment, electromagnetic radiation tuned to a particular wavelength is employed to minimize thermal energy transfer and emphasize chemical reaction. For example, ultraviolet radiation may be employed to promote many different chemical decomposition reactions. Further, microwave energy may be employed for palladium inks where the anion or ligand has hydroxyl groups, as the hydroxyl absorbs radiation in the microwave range. Decomposing a palladium precursor may be performed in the same chamber as the evaporation process, or a different one.

Spatial control for the decomposition is useful when a pattern has not already been established, e.g., during deposition of the solution onto the substrate. In a specific embodiment, a guided laser, ion beam or e-beam, is employed to provide a pattern on the surface by locally decomposing the palladium precursor according to the beam movement.

Decomposition proceeds sensitive to the substrate. For example, melting temperature of the substrate—relative to the decomposition temperature of the palladium precursor—will affect temperatures used during decomposition. If the substrate melting temperature is higher than the decomposition temperature for the palladium precursor, then decomposition may use heat at a temperature between the two without compromising the substrate. In another embodiment where the substrate melting temperature is less than or near the decomposition temperature of the palladium precursor, the decomposition provides heat (or another form of energy) to the palladium precursor at short bursts or pulses to overcome the decomposition threshold of the palladium precursor, while avoiding damage to the substrate. This is also useful for any relationship between the substrate melting (or softening) temperature and the decomposition temperature for the palladium precursor (e.g., when the substrate melting temperature is greater than the decomposition temperature of the palladium precursor) to save energy for the decomposition.

In one embodiment, a pattern of active palladium is formed when the palladium precursor solution is deposited on the substrate. This permits evaporation and decomposition to be spatially imprecise. Subsequent evaporation and decomposition of the palladium precursor then occurs spatially on the substrate according to the established pattern of solution and palladium precursor. For example, various liquid printing technologies such as conventional inkjet printers may be used to pattern the palladium precursor solution at desired locations on a flat or non-flat substrate. Resolution of the active palladium pattern then relates to the spatial resolution of the printing technology used to dispense the solution.

In a specific embodiment, decomposition (56) only occurs after evaporation (54) in order to avoid smudging of a deposited palladium precursor solution pattern and compromise of a spatially precise pattern. Further discussion of palladium precursor solution printing is described with respect to FIG. 6A.

In another embodiment, the palladium precursor solution is deposited without a pattern, and localized decomposition forms a pattern of active palladium from a blanket layer of palladium precursor. For example, a guided laser, ion beam or e-beam may be used to scribe specific locations on a blanket sheet of palladium precursor on a surface, according to a desired pattern. 2-D or 3-D beam control then permits the active palladium pattern to be produced on custom shaped 2-D or 3-D surfaces, with a pattern resolution determined by beam actuation and guidance.

Output of method 50 of FIG. 1 is a circuit precursor that includes active palladium on a surface of the substrate (patterned or not patterned). FIG. 2 expands active palladium production of method 50 for the production of a circuit.

Method 70 begins by selecting a suitable substrate (72). The choice of substrate is typically driven by a particular application for the palladium ink pattern. At a high level, the substrate may be conductive, semi conductive, or insulating. Thus, the dielectric constant of the material may be of any value. The substrate may be homogeneous or heterogeneous in terms of the material it is made from. As an example of a heterogeneous substrate, packaging for a semiconductor chip includes a dielectric substrate on which conductive vias are formed. Line traces defined by a palladium ink pattern may be patterned to connect one conductive via to another or a conductive via to an external lead or pin.

The substrate can be flat or topologically varying. An example of a non-flat substrate is the inner casing of a cell phone that has a convex and custom shape. As another example, pins on a connector may be printed with palladium ink. The connector may also include a custom or non-flat shape.

Also, the substrate may be rigid, flexible or semi rigid. There are multiple ways to characterize a flexible substrate, including elastic modulus and/or thickness. In one embodiment, a flexible substrate includes an elastic modulus less than about 1 GPa. In a more specific embodiment, a flexible substrate includes an elastic modulus less than about 100 MPa. In one embodiment, a flexible substrate includes a thickness less than about 1 centimeter. In a more specific embodiment, the thickness is less about 1 millimeter. A higher modulus of elasticity and/or thickness may also be used.

One substrate of particular interest is polyimid. Polyimid (also sold as Kapton®) is commercially available in thin sheets, is suitable for printing using many printers such as commercially available inkjet printers, and is also suitable for circuit applications that include a flexible substrate. Polyimid also includes a robust thermal stability that can withstand dual-stage heating as described in FIG. 1. Conventionally, adhesives are used to attach palladium to polyimid. The adhesives remain in the finished circuit but do not survive elevated circuit temperatures and thus compromise the thermal stability of polyimid circuits (in addition to adding thickness as described above). The present invention, however, maintains thermal stability of circuits constructed with high temperature substrates such as polyimid, in a thinner profile.

Other exemplary substrates may include polyester, polypropylene, polyethylene, ceramic materials, or any other good dielectric material. The substrate onto which the palladium precursor is deposited, and subsequently a palladium layer and conductive lines formed, can also be a metallic material. Also, the substrate can be plastic, ceramic, glass, silicon wafer, cellulose, graphite, and paper substrates. Paper readily permits printing using commercially available and general-purpose printers. In general, substrate selection is driven by an application. Many rigid circuit board applications use silicon wafers and Fr4 substrates.

The present invention may also use fibrous materials as a substrate, such as those used in a weave. For example, Kevlar strands may be dipped in a palladium precursor solution and further processed according to FIG. 1 to leave active palladium on the individual strands. The strains may then be woven according to conventional weaving techniques before or after copper or conductive lines are disposed on the strands (e.g. by electroless and electroplating).

Returning back to FIG. 2, the substrate may be pre-treated or cleaned, before the palladium precursor solution is added, to facilitate subsequent processing. Various cleaning processes are suitable for use, as one of skill in the art will appreciate. For example, a bath in isopropanol simply and inexpensively cleans many polymer surfaces. Cleaning is not necessary. One advantage of the invention is that the substrate requires relatively little or sometimes no treatment prior to deposition of the palladium precursor solution and forming of copper lines.

Figure 5:
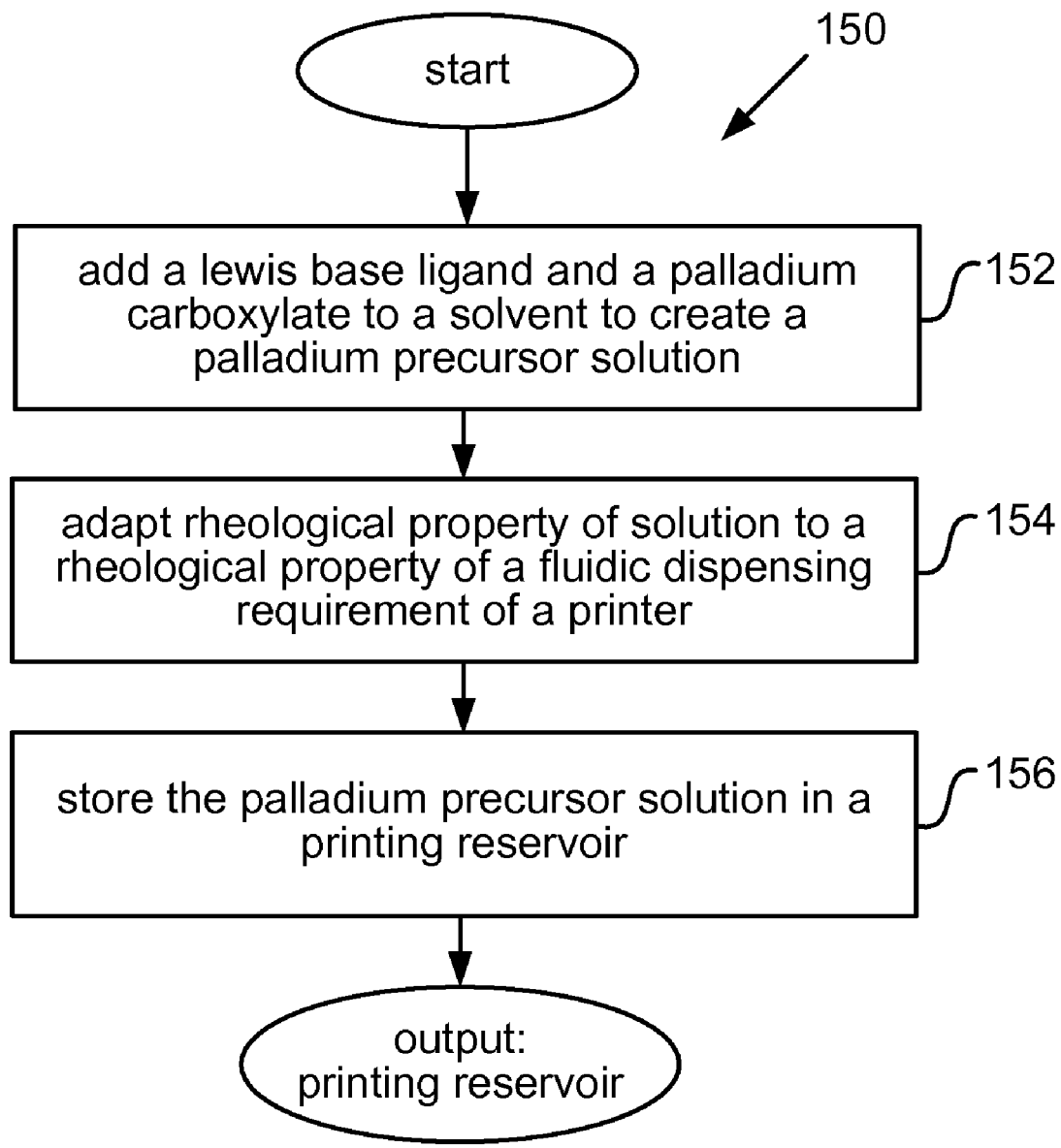
FIG. 5 shows the production of a printing reservoir that stores palladium ink in accordance with one embodiment of the present invention.
Figure 6A:
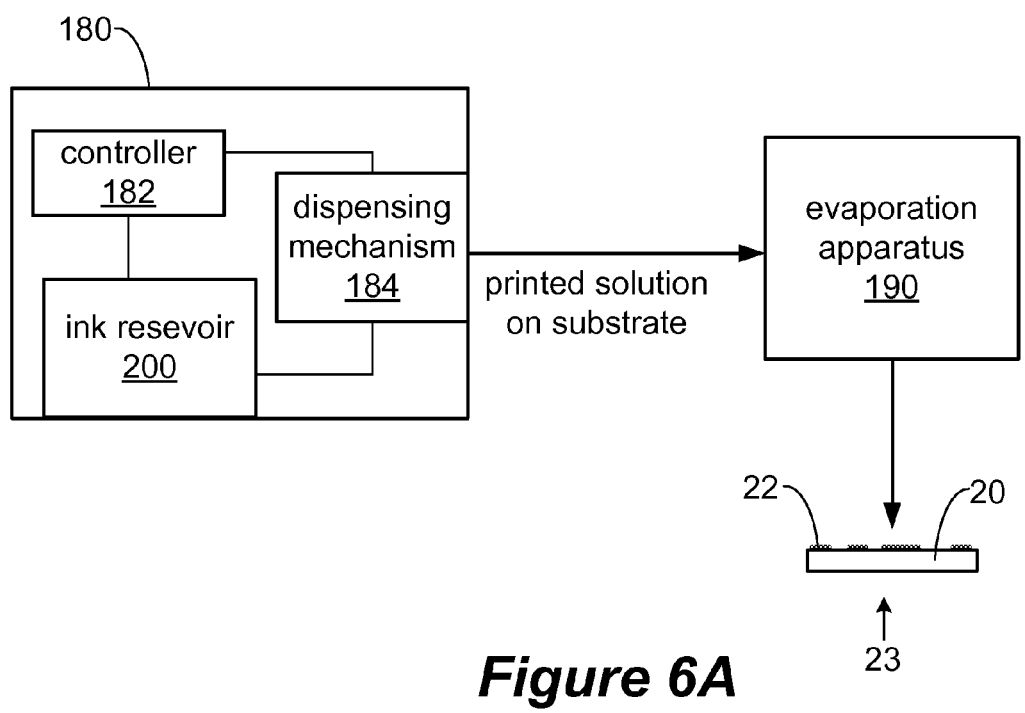
FIG. 6A shows the printing reservoir used with a printing apparatus in accordance with one embodiment of the present invention.
Figure 6B:
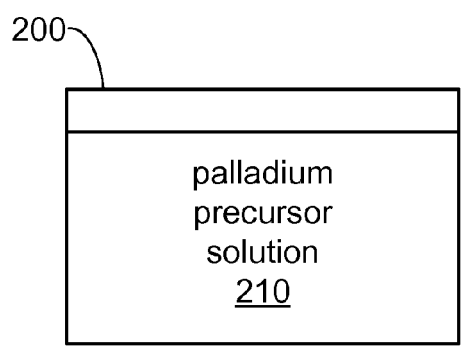
FIG. 6B shows a printing reservoir that includes palladium precursor solution in accordance with a specific embodiment of the present invention.

The palladium precursor solution is then provided for printing (74). More detail on solution chemistry is provided below, in addition to examples of reservoirs for storing and shipping the palladium precursor solution (FIGS. 5, 6A and 6B).

Palladium deposition then proceeds according to FIG. 1 (steps 52-56). Output of method 50 is a pattern of palladium on a surface of the substrate, where the pattern substantially resembles a desired conductive line or circuit pattern.

Figure 4A:
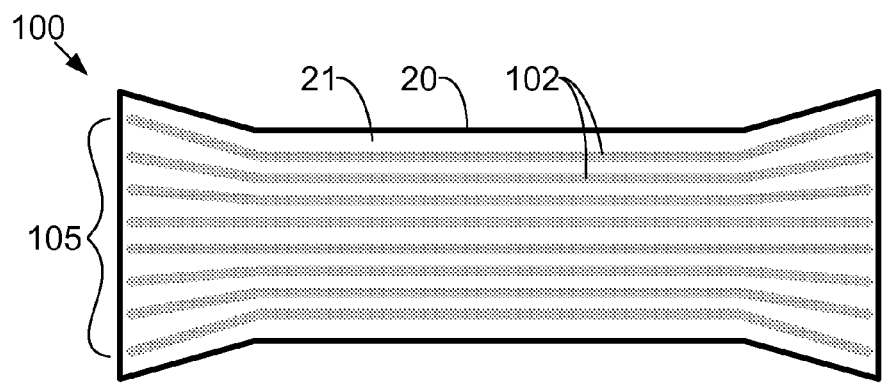
FIG. 4A illustrates an exemplary active palladium pattern on a surface of a circuit in accordance with a specific embodiment of the present invention.

A pattern of active palladium refers to one or more surface areas on a substrate that the active palladium occupies after decomposition. As will be described further below, the pattern may be established at a number of stages, e.g., during deposition using a printer or during decomposition using a spatially controlled decomposition beam. In one embodiment, the pattern includes a set of active palladium lines disposed on one or more surfaces of the substrate. Often, the pattern resembles a set of conductive lines to be subsequently produced using the pattern of active palladium. FIG. 4A illustrates an exemplary active palladium pattern 105 on a surface 21 of a circuit 100 in accordance with a specific embodiment of the present invention. Exemplary patterns also include circles, rectangles, sets of concentric circles or rectangles used for an antenna, etc. In general, the present invention is not limited to any specific pattern, and contemplates that the pattern may take any geometric arrangement.

Figure 7:
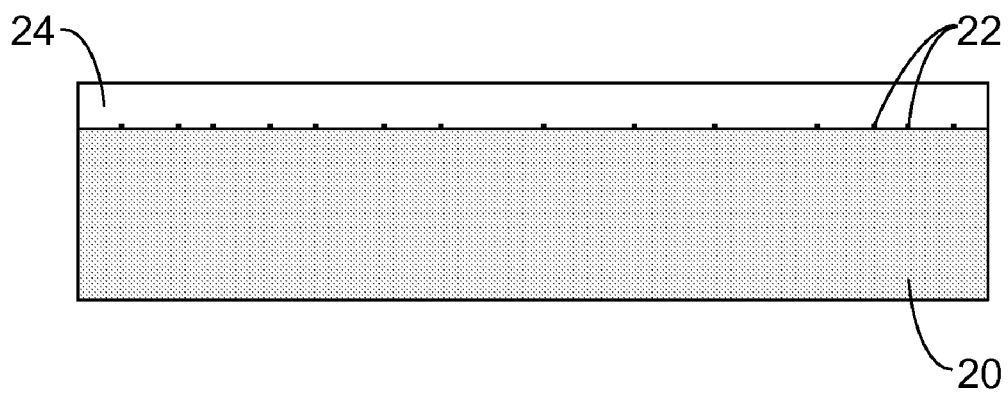
FIG. 7 shows an expanded cross section of a structure in accordance with a specific embodiment of the present invention.

In another embodiment, the pattern is a field deposition that covers a large portion of the substrate surface. Thus, an active palladium and conductive layer may also be field deposited on a substrate using methods described herein. FIG. 7 shows an expanded cross section of a substrate structure with a field deposition 24, without patterning of the active palladium 22, in accordance with a specific embodiment of the present invention.

The field deposition can be considered a blanket pattern, and has many uses. For example, a field coating is well suited for electromagnetic shielding or antenna manufacture. A field coating is also well suited for irregular shaped objects. In this case, the irregular shaped object—such as a strip of hook and loop fasteners, a brush, or a sponge—is dipped in a palladium precursor solution to apply a field deposition to the many and minute features (and the solution decomposed using an oven for example). An antenna can be made from oddly shaped objects in this manner. Thus, the present invention is also not limited by the shape of the substrate.

Returning to FIG. 4A, circuit 100 is disposed on a flexible tape of polyimid. Pattern 105 includes a series of palladium lines 102 that are shaped to facilitate the subsequent formation of conductive lines 112 (FIG. 4D). Production of lines 102 and pattern 105 will be described in further detail below.

Figure 4B:
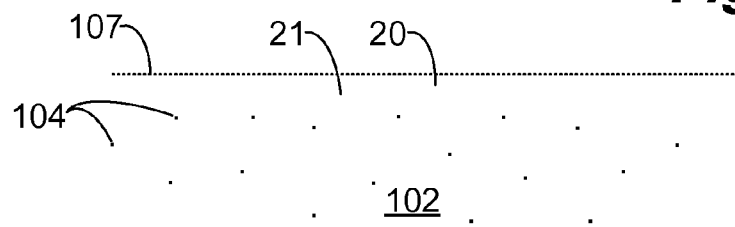
FIG. 4B shows an illustrative microscopic view of a single palladium line from FIG. 4A.

FIG. 4B shows an illustrative microscopic view of a single palladium line 102. The palladium line 102 includes a series of separate and disconnected active palladium atoms 104 on the surface 21 of substrate 20. Since the metal ions 104 are not connected, palladium line 102 is not conductive.

Collectively, the palladium atoms 104 on surface 21 approximately have a zero valence. It is understood that some atoms may have a slightly different valence due to processing disturbances and imperfections.

Borderlines 107 are dotted to illustrate that they approximate boundaries for the deposition of active palladium ions 104. As will be described with respect to FIG. 4C, copper initially accumulates on surface 21 according to the atomic locations of palladium 104. In some instances, depending on the how much metal is added the metal deposition process, copper accumulation may extend outside of borderlines 107.

Palladium deposition according to the present invention uses low surface concentrations of active palladium. At a minimum, deposition generates enough palladium on the surface to form metal conductive lines according to a subsequent metal deposition technique. For example, for electroless copper deposition, the palladium surface concentration is high enough to initiate electroless plating. In one embodiment, palladium line 102 has a surface concentration of less than about $6 \times 10^{-10}$ gram atoms of palladium per square millimeter. In this case, the active and elemental palladium 104 surface concentration is so low that the palladium 104 does not form a conductive layer on substrate 20. In other words, while some atoms may contact, palladium 104 generally does not leave a high enough surface density to have consistent contact to permit conductivity of electrons along palladium lines 102. In a specific embodiment, palladium line 102 has a surface concentration of less than about $3 \times 10^{-7}$ gram atoms of palladium per square millimeter. It is understood that some of these concentrations may not be visible to a human eye without magnification.

Figure 4C:
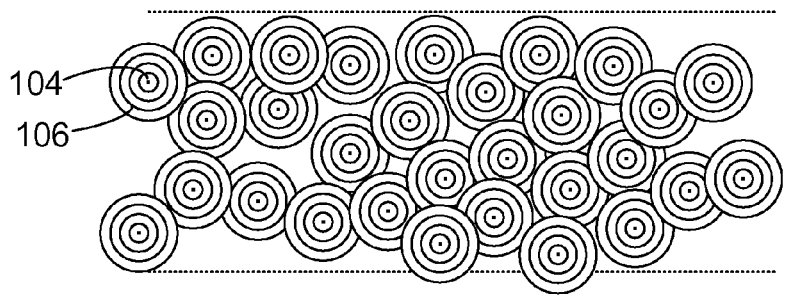
FIG. 4C illustrates initial radial growth of copper from the palladium atoms on a surface of a substrate, according to growth that might be witnessed in an electroless plating process for example.
Figure 4D:
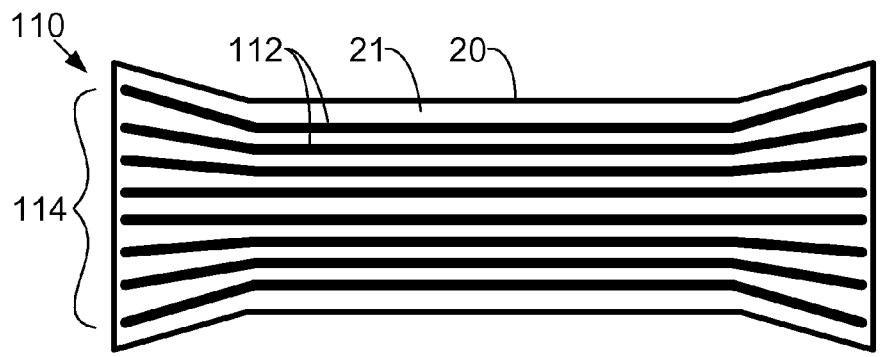
FIG. 4D illustrates a circuit produced according to the exemplary active palladium pattern of FIG. 4A.

Referring to FIGS. 2 and 4C-4D, conductive line formation (76) uses one or more metal deposition techniques that benefit from the presence of active palladium atoms on a surface of the substrate. Metals suitable for use for the conductive lines may include copper, gold, nickel silver and cobalt alloys. For example, the conductive line may include palladium atoms disposed under a copper layer with a thin outer layer of gold deposited over the copper. Other metals may be used for conductive line formation.

As one of skill in the art will appreciate, a wide variety of conductive line formation techniques are suitable for use with the present invention. Plating is the general name of surface-covering techniques in which a metal is coated onto a solid surface. Numerous plating methods conventionally used today may benefit from active palladium. Such techniques include: vapor deposition under vacuum, sputtering, chemical vapour deposition with or without a vacuum, and other methods using vacuum or gas conditions. Thin film deposition plating techniques have accomplished plating on scales as small as the width of an atom. Metallizing refers to the process of coating metal on non-metallic objects. One metallizing technique suitable for use herein applies a two step process that: a) deposits copper on a seed layer palladium pattern by electroless deposition (using a conventional copper electroless deposition process); and b) uses electroplating to add more copper on top of the electroless copper to produce thicker copper lines. Other conductive line formation techniques are also suitable for use herein, and in general, the present invention is not limited to any particular manufacturing technique for creating conductive lines on a surface that already includes a palladium precursor.

FIG. 4C illustrates initial radial growth of copper from palladium atoms 104 on surface 21 of substrate 20. This illustration approximates copper growth that might be witnessed in an electroless plating process, for example. As shown, the active palladium 104 anchor to the substrate 20 and initiate attachment of copper on surface 21 according to their location. The newly attached copper then facilitates further radial copper deposition (and platelet-like growth). Copper thus accumulates radially from each palladium ion 104 on surface 21 of substrate 20, as indicated by temporal growth lines 106.

As electroless copper deposition proceeds, contact between adjacent copper growth lines 106 occurs. Continued metal deposition adds enough metal to form and gain electrical conductivity along lines 112.

The copper deposition also occurs normal to surface 21 (normal to the page as shown). Notably, then, as copper deposition continues, the initial palladium atoms are buried under the aggregating copper and no longer visible. For the circuit 110 having pattern 114 shown in FIG. 4D, it is most likely that no active palladium ions 104 will be visible since they are all buried under considerably much more copper. And given that the amount of active palladium ions 104 is relatively small compared to the amount of copper, detection of palladium 104 becomes difficult after conductive lines 112 have been formed.

In this manner, the active and elemental palladium 104 disposed on surface 21 acts as a seed to catalyze deposition of a metal on substrate 20. Controlled spatial patterning of palladium lines 102 then permits uncontrolled patterning of conductive lines 112, which blindly follows the established spatial pattern and arrangement of palladium lines 102.

While FIG. 4A shows one specific active palladium pattern 105, the present invention is not restricted to any specific number or arrangement of lines. Typically, the active palladium pattern substantially resembles the conductive line pattern included in circuit after copper deposition is finished. In some cases, palladium lines 102 may be slightly thinner than conductive lines 112 to permit for expansion of the conductive lines during copper deposition in one or more stages, e.g., electroless deposition followed by electroplating. As will be described in further detail below, the present invention also permits active palladium patterns on 3-D and custom shaped surfaces.

It should be noted that the palladium printed substrate 100 of FIG. 4A can be an end product by itself. In other words, a manufacturer may be responsible for printing partially manufactured circuits 100 that do not yet include conductive lines. These partially manufactured circuits 100 are then provided to a second manufacturer responsible for adding a metal to form the actual conductive lines.

The palladium precursor solution may be delivered to a substrate in any of a number of different manners. In one embodiment, the solution is delivered only to selective regions of the substrate according to a desired pattern. This spatial selectivity is referred to herein as "printing" the palladium precursor solution on the substrate. In other embodiments, the palladium precursor solution coats the entire substrate or a large portion thereof. This may be accomplished via a printer (where the entire surface is selected for printing), dip coating, or another blank printing procedure. In such cases, the blank palladium precursor solution may or may not be subsequently patterned to produce the pattern. When dispersed by a printer or automated printing process, the palladium precursor solution may be considered, and referred to herein, as an 'ink' or a 'palladium ink'.

FIG. 5 shows the production of a printing reservoir that stores a palladium ink in accordance with one embodiment of the present invention. FIG. 6B shows a printing reservoir 200 (the output of FIG. 5) that includes palladium precursor solution 210 in accordance with a specific embodiment of the present invention. FIG. 6A shows the printing reservoir 200 used with a printing apparatus 180 in accordance with one embodiment of the present invention. While printing according to FIGS. 6A and 6B will now be described with respect to an apparatus, those of skill the art will recognize of the following description also applies to methods and steps for producing printed circuit precursors.

Referring initially to FIG. 6A, printing apparatus 180 refers to a mechanized system that delivers palladium precursor solution 210 onto a substrate to form a circuit precursor 23. Printing apparatus 180 generally includes: controller 182, dispensing mechanism 184, and palladium ink reservoir 200.

The exact structure of printing apparatus 180 and each of its components will vary with the printing technique employed, as one of skill in the art will appreciate. Indeed, an advantage of the present invention is that it may use a commercially available printing technique or apparatus without the need for special retooling or reconfiguration for printing palladium precursor solution 210. In other cases, printing apparatus 180 is specially manufactured and/or configured for printing circuits according to techniques described herein.

The printing apparatus 180 may include a contact or contact-less printing technology, and/or signal-directed, manual or mechanical means. For example, printing apparatus 180 may employ any one, or a combination, of the following printing technologies: ink-jet printing, screen printing, pad-printing, spray coating, spin coating, puddle coating, dip coating, Gravure printing, ultrasonic spray techniques, wire coating, a stencil, rotogravure, flexographic techniques, brush coating, or various other blank coating techniques. Monochrome printing is suitable in many instances. A specific printing technology may be selected according to its benefits for a particular application. For example, ultrasonic spray techniques are well suited to deposit uniform thickness coatings.

Dispensing mechanism 184 is configured to transfer the palladium precursor solution 210 from reservoir 200 to a substrate 20. The structure of dispensing mechanism 184 will depend on the printing technology used. For example, a conventional inkjet printer often includes a small printing tube with a known volumetric capacity that the palladium ink fills into. A control signal causes an actuator, such as a piezoelectric actuator, to squeeze the tube and dispense ink from the tube onto the substrate. For 2-D inkjet printing, a linear actuator moves the tube in a direction orthogonal to a direction of substrate feed, thereby providing 2-D printing onto a substrate. The tube then expands and contracts according to an applied waveform or control signal that matches a known position of the tube relative to a current position of the substrate. In this manner, any custom pattern 105 (FIG. 4A) may be disposed on a substrate according to a control signal that corresponds to the pattern.

In a specific embodiment, printing apparatus 180 includes a general-purpose printer. For example, this may include a printer traditionally used with personal computers and commercially available from a wide variety of vendors, including retail vendors and the like. One suitable personal printer is the Epson C66, available from a wide variety of vendors, reconfigured with an ink cartridge that includes palladium ink as described herein. The general-purpose printer may also include any printer used in the printing industry, such as commercially available models used to print on banners and large sheets. One suitable larger printer is the Roland SP300V available from Roland DG Corporation of Hamamatsu, Japan. These general-purpose printers are generally configured to print on thin sheets made from substrates such as commercially available paper or polyimid. One suitable commercially available printer includes ink-jet printers. The present invention then stores palladium precursor solution 210 in a printing cartridge 200 that mechanically interfaces with the general-purpose printer.

Printing apparatus 180 may also be configured to interact with a personal computer, which is used to supply printing patterns to printer 180. A user interface on the personal computer permits external control of printing on apparatus 180. The user interface also permits easy reconfiguration and printing of new patterns and circuit designs—without special retooling of printing apparatus 180 for each new pattern or circuit. In this manner, new circuits may be printed as readily as a conventional general-purpose printer produces new paper documents.

One suitable class of printing may be broadly characterized as "drop on demand" printing. In these processes, a drop of palladium ink is created wherever necessary on a substrate as regulated by controller 182. Controller 182 may include any combination of a processor and/or memory suitable configured to output a signal to control dispensing mechanism 184. In one embodiment, the signal is digital and corresponds to a pattern for the palladium precursor. The pattern may be received from an external computer that controller 182 interfaces with. Controller 182 may include one or more commercially available processors that interact with a memory that stores instructions and information suitable for printing patterns on one more substrates. The memory may include RAM, ROM, hard drive space, tempering memory such as a memory stick or CD-ROM, etc.

Spatially controlled printers permit easy and fast circuit reconfiguration where only the control signal needs to be changed to produce a new circuit design or layout. Thus, the present invention contemplates circuit manufacture according to digital design without mechanical reconfiguration or downtime of a circuit manufacturing line. For example, some commercially available inkjet printers are suitable for printing circuit precursors 23 on flexible polyimid substrates one or two at a time (or more, if desired). This permits research organizations, universities and other small businesses to own custom circuit manufacturing technology, without having to outsource the production of one or two custom circuits. Thus, the present invention contemplates business models where printers are sold with the intent of enabling small organizations to do their own circuit printing and manufacture.

Another class of printing may be broadly characterized as "image" printing. For example, Gravure printing may also be used for printing apparatus 180. As a dispensing mechanism 184, Gravure printing employs a depressed or sunken surface for the image that is etched or engraved into a cylinder; the unetched areas of the cylinder represent the non-image or unprinted areas. The cylinder rotates in a bath of ink called the ink pan (in this instance, reservoir 200 includes a Gravure ink pan that stores palladium precursor solution 210). As the cylinder turns, the excess ink is wiped off the cylinder by a doctor blade. The palladium ink remaining on the cylinder forms a palladium pattern 105 by direct transfer to the substrate (paper, polyimid or other material) as it passes between a plate cylinder and an impression cylinder. Gravure printing is well suited for static image, long run, high quality printing that produces a sharp, fine image.

In another embodiment, printing apparatus 180 permits conformal printing. Conformal printing refers to printing palladium ink 210 on non-flat and three-dimensional surfaces. For example, the non-flat surface may include the inner surface of a cell phone housing or other portable electronics device, which is commonly curved and custom shaped. In one embodiment, conformal printing apparatus 180 includes a pen, movable in three dimensions, that dispenses palladium ink 210 in response to a control signal. Based on a known position of the controlled pen relative to the non-flat substrate, ink is released at controlled times and a pattern is then produced on the conformal surface as desired.

The conformal printing apparatus 180 may include any robotic system that tracks: a) the substrate (or part such as a cell phone housing); b) the dispensing mechanism 184; or c) combinations thereof, to provide 3-D relative motion between the substrate and dispensing mechanism 184. For example, dispensing mechanism 184 may include a 3-D robotic actuator that moves a pen or dispensing mechanism to the custom shape of a non-flat substrate.

Resolution of a printed palladium pattern 105 (and subsequent conductive line resolution) will vary with the printing apparatus 180. In general, resolution may be limited to droplet size for the printing apparatus. In some cases, printing capabilities of the printing technology may be used to improve resolution and pattern output. For example, the dots or drops per inch used in an inkjet printer will affect droplet size and may be tailored to increase pattern resolution. In addition, for many conventional and general-purpose inkjet printers, a grayscale level setting changes the number of passes that the dispensing mechanism makes across a substrate. Decreasing the grayscale setting then decreases the number of passes that the dispensing mechanism makes, and thereby reduces the number of drops and quantity of palladium deposited onto the substrate. In one embodiment, printing apparatus 180 provides a printing resolution for a printed palladium pattern 105 of about 10 microns. In another specific embodiment, a line density of greater than about 1 line per millimeter is suitable for use. A printing resolution of about 100 microns is suitable in many applications. In another embodiment, printing apparatus 180 outputs droplets between about 15 and about 20 picoliters.

Line thickness is another suitable measure of printing resolution. In one embodiment, the present invention prints lines with a planar thickness up to about 2 microns. In a specific embodiment, a palladium pattern includes a line with a surface width of less than about 250 microns. Thicker lines may be used. As one of skill in the art will appreciate, the line width and spacing will depend on the printing technology and desired pattern.

It is understood that some printers may use multiple passes to achieve the desired palladium concentration on a surface. For example, a printing apparatus may print a palladium precursor solution, having a concentration of palladium of about 0.01, five times to achieve a desired concentration on the substrate (such as 0.05). This permits lower concentrations of palladium and solution to be used in a printing reservoir.

Various processes and printing apparatus for blanket depositing of palladium ink may also be employed. A blanket deposition involves coating a large portion or the entire substrate surface with the palladium ink and without defining a pattern. Dip coating represents one suitable method for blanket deposition of palladium ink. Dip coating allows substrates in any shape and size to have palladium precursor solution disposed thereon. For example, strands and fibers such as those later weaved together may be dip coated, in addition to non-flat surfaces described above.

The blanketed palladium precursor is then later altered to produce a desired pattern. Patterning a palladium pattern 105 onto a blank ink of deposition is referred to in here as 'scribing'. In one embodiment, scribing occurs during decomposition of the palladium precursor remaining after the solvent is evaporated off. As mentioned above, decomposition typically includes adding energy to the palladium precursor. One suitable scribing process uses a laser writing process. While the palladium precursor is adhered to the surface, a laser beam is applied to the surface at positions where it is desired to have the palladium remain according to a desired palladium pattern 105. The laser beam has an energy and/or wavelength chosen to decompose the palladium precursor (e.g., palladium carboxylate) to form elemental palladium that adheres to the surface. After the laser writing process is complete, the substrate may be washed or otherwise treated in a manner that removes the unreacted palladium precursor from the surface. At the end of this process, a pattern of elemental palladium 104 remains on the surface at desired locations according to the desired palladium pattern. Spatial resolution of the active palladium pattern then depends on the spatial resolution of the laser and/or its actuators.

As mentioned above, the decomposition of a palladium precursor may use any combination of heat, an e-beam, an ion beam, a laser, or the like. An e-beam or an ion beam also permits actuated control of a small beam that permits patterning of the palladium precursor. Pattern resolution will depend on the actuation and size of the beam. Optics may be used to decrease beam size increase resolution of pattern 104.

Returning back to FIG. 6A, the output of printing apparatus 180 is a substrate with the palladium precursor solution printed thereon. As mentioned above, this may be with a specific pattern that resembles a desired final pattern for conductive lines a substrate and circuit (FIG. 4A), or a blank patterning that requires subsequent scribing to achieve the desired circuit pattern.

Evaporation apparatus 190 receives the substrate and exposes the palladium precursor solution to conditions that promote evaporation of a solvent from the palladium precursor solution to leave a palladium precursor 22 on the substrate. Evaporation apparatus 190 may include any system for transferring heat (or another form of energy) to the substrate and/or solvent. Heat transfer via conduction, convection, radiation, and combinations thereof, are suitable for use with apparatus 190. Evaporation apparatus 190 may vary with printing apparatus 180. For example, Gravure printers often use a gas fired or electric fired drier to dry the Gravure ink and drive off any solvents or water, which essentially replaces most of the solvent, from the substrate. An inkjet printer may use rollers with an elevated temperature to transfer heat to the substrate and dry the palladium ink. Evaporation apparatus 190 outputs a circuit precursor 23 that includes palladium precursor 22 on a substrate 20.

In one embodiment, the evaporation process is coupled with palladium ink deposition. For example, the palladium ink 210 may be partially pre-heated as it is disposed on the substrate. A second round of heating then evaporates the solvent from the substrate, albeit with less energy than normal since the ink has already been pre-heated.

In another embodiment, solvent evaporation is coupled with the decomposition process. In this case, evaporation apparatus 190 is part of a larger apparatus that also performs decomposition of the palladium precursor.

In yet another embodiment, a separate chamber 190 is provided solely for evaporation. For example, this may include a curing oven whose thermal performance is adapted to specifically evaporate solvent from circuit precursors 23. In many processes in which a pattern of active palladium is to be formed on the surface at a high resolution, it may be desirable to first evaporate solvent from the deposited palladium ink—and only after this to decompose the palladium precursor to form the palladium metal ink pattern. To this end, it is desirable to expose the substrate and/or solution to conditions that promote evaporation and transfer heat to the solvent prior to conditions that decompose the palladium precursor (e.g., palladium carboxylate). This reduces the likelihood of "smudging" the ink pattern that is to remain on the substrate. This is particularly useful in sub-ten micron patterning.

Turning now to FIGS. 5 and 6B, printing reservoir 200 will now be expanded upon. The manufacture and construction of printing reservoir 200 will also vary with the type of printing apparatus 180. In general, the function of printing reservoir 200 is to store a palladium precursor solution 210. For a particular inkjet printer, printing reservoir 200 will mechanically and electrically resemble a printer cartridge designed to interface with that particular inkjet printer. For Gravure printing, printing reservoir 200 will resemble the ink reservoir according to a particular Gravure apparatus.

Printing reservoir 200 may often be sealed prior to usage to extend shelf life of palladium precursor solution 210. Further description of shelf life and selecting chemical components to extend shelf life are described below with respect to solution chemistry.

FIG. 5 shows a method 150 for manufacturing printing reservoir 200 in accordance with one embodiment of the present invention.

Method 150 begins by adding a Lewis base ligand (nucleophile) and a palladium compound such as palladium carboxylate to a solvent to create the palladium precursor solution 210 (152). In a specific embodiment, palladium propionate was prepared by treating commercially available palladium acetate in excess propionic acid. The mixture was maintained at about 40° C. for about 24 hours followed by removal of excess propionic acid under a vacuum at room temperature. The resulting solid is soluble in amyl acetate. In another specific embodiment suitable for printing on polyester, a solution of palladium propionate having 0.05% palladium by weight was prepared in amyl acetate. Aniline was added in a stoichiometric amount that corresponds to 2 moles of aniline per gram atom of palladium. This clear solution was then suitable for printing. Another suitable composition include a 1:1 mole ratio of pyridine and a 1:2 complex with cyclo pentyl amine (2 moles of cyclo pentyl amine per gram atom of palladium). The particular Lewis base ligand, palladium compound, and solvent will depend on an application, and may also vary with the printing apparatus used. Further description of the chemistry included in palladium precursor solution 210 is described below.

Rheological requirements for ink used in each of the printing technologies described above may vary. In one embodiment, palladium precursor solution 210 is adapted during manufacture to one or more rheological properties of a fluidic dispensing requirement of a printer (154). The rheological property may include one or more of: surface tension, density and viscosity (and combinations thereof) for palladium precursor solution 210 and/or a rheological fluidic dispensing requirement of a printer. For example, Gravure inks preferably include a low viscosity that allows them to be drawn into engraved cells in a cylinder and then transferred onto a substrate. Many inkjet printers tune the waveform supplied to their piezoelectric actuator according to rheological properties of their preferred ink, e.g., for quality control of printed output. Inks with rheological properties that do not match the tuned waveform often produce lesser quality printed output. Providing a new or different ink, such as palladium precursor solution 210, to a commercially available in general-purpose inkjet printer may then require the ink to conform to a tuned waveform or other printing apparatus rheological property.

The present invention contemplates multiple ways to adapt palladium precursor solution 210 to a rheological property of a fluidic dispensing requirement of a printer. In one embodiment, the palladium precursor solution is adapted to the rheological property of the fluidic dispensing requirement. In this case, one or more of the Lewis base ligand, palladium compound, and/or solvent selected to provide a particular aggregate rheological property for palladium ink 210. For example, the solvent may be chosen with particular density or viscosity to match that desired by a particular printing apparatus 180.

In another embodiment, the palladium ink includes an additive that adjusts a rheological property of the palladium precursor solution to a rheological property of a fluidic dispensing requirement of printing apparatus 180. For example, the additive may include a surfactant that changes surface tension and/or density of palladium ink 210. Surface tension of palladium ink 210 often affects droplet size for an inkjet printer that deposits the ink onto a substrate. The particular substrate material may also affect surface tension for the printer; paper often has a different droplet size then a smooth surface associated with a polymer such as polyimid. In either instance, the surfactant may be selected to achieve a desired droplet size for a particular inkjet printer and a particular substrate material. Preferably, the additive is selected to be chemically inert to the active palladium left on the substrate. In one embodiment, the additive is selected to also be chemically inert to the printing apparatus.

Other additives may be included in palladium ink 210. It is generally desirable for palladium ink 210 to not substantially corrode one or more components of printing apparatus 180. Since the palladium precursor solution 210 may be used with off-the-shelf general-purpose printers and may include chemistries not intended for these general-purpose printers, corrosion of printing components may occur. In this sense, corrosion refers to dissolving of palladium ink 210 into one or more components of the printer, chemical attachment of palladium ink 210 into one or more printer components, softening of the printer components due to the presence of palladium ink 210, or any change in a mechanical or physical property of a printer component. As the term is used herein, substantial corrosion refers to functional degredation of one or more chemical or mechanical properties for components in a printing apparatus 180. For example, an ink solution should not corrode plastic components in a printer to the point where the components soften, are penetrated by the ink, or lose mechanical tolerances. In one embodiment, one or more of the Lewis base ligand, palladium compound, and/or solvent are selected to avoid printer component corrosion. Ideally, there is zero degradation over time. In one embodiment, a time limit quantifies the substantial corrosion. In one embodiment, substantial corrosion refers to noticeable functional or performance degradation of a printing apparatus or a component after about 6 months of ink use. In a specific embodiment, substantial corrosion refers to noticeable functional degredation of the apparatus after about 3 months. In another specific embodiment, the palladium precursor solution has a shelf life, where the palladium precursor solution is at least 90 or 95 percent intact, of greater than 1 month when added to the solvent.

The present invention then stores the palladium precursor solution 210 in a printing reservoir 200 at step 156 of FIG. 5. The reservoir may resemble a cartridge that mechanically interfaces with a general-purpose printer such as an off-the-shelf inkjet printer. Alternatively, reservoir 200 may physically resemble an ink well used in Gravure printing.

The palladium precursor solution 210 may be characterized by the concentration of palladium included therein. In one embodiment, solution 210 includes a concentration between about 0.5 percent and about 0.002 percent palladium by weight. In a specific embodiment, solution 210 includes a concentration between about 0.05 percent and about 0.2 percent palladium by weight.

Having described circuit manufacturing and printing processes, chemistry suitable for use with the present invention will now be expanded upon.

Previous attempts to form structures reliant on palladium seed layers by decomposing a deposited palladium compound have been ineffective. While not wishing to be bound by theory, it is believed that these attempts failed to form isolated palladium atoms on the substrate and therefore did not provide good adhesion. The prior palladium deposition techniques typically employed palladium precursors that would tend to form groups or agglomerates of associated palladium atoms on the substrate surface. These groups of palladium atoms do not adhere well to most substrate surfaces.

The inventors have identified and developed the concept of "active" palladium. This is palladium metal that has two desirable properties: (1) it is catalytic for subsequent addition of a metal onto the palladium (such electroless deposition), and (2) it anchors the deposited metal to the underlying substrate. In some cases, the active palladium may also be characterized as being disposed monatomically or even sub-monatomically on the substrate. At some point in the process, the deposited palladium should have approximately zero valence.

The estimation of active palladium as generally having a zero valence recognizes that the deposition process may not be perfect in forming all palladium with a zero valence, and minor amounts may stray therefrom. Elemental palladium with a zero valence is particularly active, and well-suited to initiate attachment with copper or another metal used in the conductive lines. As mentioned above, elemental palladium does not readily bind to a surface monatomically, and needs to be deliberately processed to achieve such a state.

Deposition chemistry and processing techniques chosen by the inventors provide strong active palladium anchoring by leaving isolated monatomic palladium (rather than clusters of palladium atoms), and by producing approximately zero valence atoms on the substrate. For example, palladium carboxylate precursors, decomposed with suitable input energy, leave isolated palladium atoms with approximately zero valence on the substrate after decomposition. The active palladium atoms so deposited can bind to both the substrate and a metal subsequently deposited thereon. The palladium atoms then act as individual and separate anchoring points between the substrate and metal, which promotes better adhesion of conductive lines. In some ways, the deposited palladium atoms resemble atoms deposited on a substrate by a physical vapor deposition technique such as sputtering.

The palladium chemistry and deposition techniques invented by the inventors emphasize process conditions and starting products that are believed to promote formation of isolated palladium atoms on a substrate surface. This is believed to be in contrast to prior techniques. In certain embodiments, it is believed that, in addition careful selection of palladium solution components, the deposition technique can have a positive impact on the quality of active palladium deposited. In one example, the process involves first driving off solvent from a deposited palladium solution, and then decomposing the remaining material using added energy (e.g., using an ultraviolet source or laser for example) to produce the active palladium.

It has been recognized by the inventors that palladium compounds such as palladium carboxylates easily form loose assemblies such as dimers and trimers in solution. In these assemblies, the palladium atoms of individual molecules may cluster head to head. The inventors discovered that without addressing this phenomenon, the resulting elemental palladium formed after decomposition does not adhere well to the substrate. Adding a strong Lewis base (e.g., a stronger electron donor than the carboxylate or other anion in the palladium precursor) may break the bridging between palladium compounds and form a solution in which the palladium precursor compounds remain relatively isolated from one another. When the palladium precursor from such solution is decomposed on a substrate surface, it is believed that elemental palladium tends to deposit as individual atoms rather than as a cluster. This forms essentially monatomic anchor points for the palladium itself as well as subsequently deposited copper or other metal.

Generally, the palladium precursor solution includes a Lewis base ligand and a palladium compound in a solvent. The choice of a particular palladium precursor and solvent may be dependent upon a particular substrate on which the palladium and subsequent conductive lines will be deposited, or a particular manufacturing process, as one of skill in the art will appreciate.

Before providing an expanded description of particular components, one or more optional desirable properties of a palladium precursor solution will first be discussed. Constituents of the palladium precursor solution may be selected to produce one or more properties. In one embodiment, the solvent, palladium-containing compound and Lewis base ligand are all organic substances. Suitable examples are described below. In another embodiment, the Lewis base ligand and a palladium compound are selected such that decomposition products of the palladium precursor solution decompose relatively easily. For example, the constituents may be selected to have a certain decomposition temperature. The Lewis base ligand and a palladium compound may also be selected such that decomposition products are benign and/or easily removed. Examples of suitable decomposition products include carbon monoxide, carbon dioxide, water and a fragmented or an unfragmented ligand. When the decomposition uses heat or high energy, the water often releases as a vapor.

In addition, the decomposition products preferably do not affect the substrate being printed upon. In one embodiment, none of the decomposition products are oxidizers or strong reducing agents. Again, decomposition by-products such as carbon monoxide, carbon dioxide, and water are suitable in this regard.

In another embodiment, the palladium-containing compound is chosen such that the palladium precursor solution has a sufficient shelf life for a desired application. As the term is used herein, shelf life refers to the rate of functional decomposition of the palladium precursor solution. Preferably, the solution does not decompose at any measurable rate, or has no technical decomposition by a certain date defined by the shelf life. Decomposition may appear as metallic deposits or visual precipitation in the solution in which the palladium decomposes out of the solution onto walls and other structures. In one embodiment, the shelf life is greater than three or six months, and more preferably greater than 6 weeks. Of course if the intent is to use the precursor solution immediately or very soon after it is created, shorter shelf lives may be acceptable. In a specific embodiment, the palladium precursor solution has a shelf life, where at least 95% by weight of the palladium precursor remains intact, for longer than 3 months after the solution is formed. Even longer shelf lives may be desirable in some contexts, particularly those in which extended storage may be needed. As described above, the present invention is well-suited for use with printing technologies where the palladium precursor solution is stored in a reservoir or ink cartridge used with a printer. Storage in such a reservoir may occur for months or years before use, and the ink cartridge may remain in a printer for months or years once installed. Selection of a palladium-containing compound to promote solution longevity is thus important in ink distribution business models and applications such as these. Selection of an inert material for the ink reservoir, such as glass or an inert polymer or polymer coating, also extends shelf-life.

In another embodiment, constituents of a palladium precursor solution are chosen to facilitate deposition of the solution. Four such examples are now provided.

Example #1

Preparation of Palladium(II) Propionate 5 gm commercial palladium(II) acetate trimer (Aldrich) was added to 40 g of propionic acid. The mixture was maintained at 40 degrees Celsius for 24 hours. Excess propionic acid was removed under vacuum at room temperature. The resulting yellow solid was used for making palladium inks.

Example #2

0.075% palladium (II) solution in amyl acetate was prepared by dissolving 0.357 g of palladium (II) propionate, prepared as described in Example #1, in 199.643 g of amyl acetate. The solution thus formed was filtered through 0.45 µm PTFE acrodics. 0.241 g of cyclopentylamine (2 equiv. w.r.t. Pd atom) was added to the clear solution. The solution immediately turned from brownish yellow to pale yellow. Two polyester coupons of "5.5×6" inch and "5×9" inch were dipped in this palladium (II) solution for three minutes and heated on a hot plate kept at 160 degrees Celsius. The coupons were dipped in electroless copper solution for about 1 minute. A uniform copper layer developed on substrate.

Example #3

0.125% palladium (II) solution in amyl acetate was prepared by dissolving 0.297 g of palladium (II) propionate (prepared as described in Example #1 above) in 99.703 g of amyl acetate. 0.337 g of tripropylamine was added to the clear solution. Polyester coupons of "9×9" inch were coated with this solution using camel brush at 50 degrees Celsius and kept in oven at 130 degrees Celsius for 8 minutes. The coupons were dipped in electroless copper solution. A uniform layer of copper developed on substrate.

Example #4

0.125% palladium (II) solution in amyl acetate was prepared by dissolving 0.297 g of palladium (II) propionate (prepared as described in Example #1 above) in 99.703 g of amyl acetate. 0.239 g of Diisopropylamine was added to the clear solution. A polyimide substrate "5×6" was dip-coated in this solution, air dried and heated at 170 degrees Celsius for 5 min. The coupon was dipped in electroless copper solution until a uniform copper layer is deposited on the substrate.

Palladium precursor solution components may also be tuned to an application. As described above, solution components may be selected to adapt one or more rheological properties of the fluid that are important for printing. Alternatively, solution components may be selected according to a specific substrate being printed on; specific examples are provided below.

The palladium precursor solution components will now be separately expanded upon.

The palladium-containing compound in the palladium precursor solution acts as a palladium carrier. The palladium-containing compound may be selected according to one or more of the following properties: a) be soluble in a particular solvent employed in the palladium precursor solution; b) be compatible with the chosen Lewis base ligand (e.g., be a weak Lewis acid); and/or c) be relatively inexpensive.

Various palladium carboxylates meet most or all of these criteria. In one embodiment, it is desirable to limit the size of a carboxylate to ten carbons or less. In another embodiment, it is desirable to limit the size of a carboxylate to six carbons or less. In a specific embodiment, the palladium carboxylate has two to five carbon atoms. In another specific embodiment, the palladium carboxylate has three to five carbon atoms. One preferred carboxylate is a propionate. Examples of other palladium carboxylates that may be employed are in some embodiments are palladium acetate, palladium oxalate, and palladium iso-butyrate. Note that use of relatively short chain carboxylates may help avoid the undesirable decomposition processes that produce elemental carbon. In general, while palladium is bivalent it need not have two separate carboxylate groups. In some examples, the carboxylate may include 2 or more carboxylic acid groups (e.g, it could be an acetate and a proprionate). Further, the carboxylate can be fully saturated or include one or more unsaturated bonds, and it can be straight chained or branched. For dicarboxylic acid compounds, one of the carboxylate groups could be separately reacted to form an ester.

The palladium-containing compound may be selected to have a good shelf life when not in a solution, in addition to its shelf life when in solution. For example, the palladium compound may not include hygroscopic properties so as to avoid degradation over time by attracting water. Palladium (ii) acetate is suitable in this regard.

As mentioned, decomposition properties of the palladium compound may also affect selection (along with decomposition properties of the Lewis base ligand, as described below). For example, palladium carboxylates having a decomposition temperature in the range of about 100° C. to 240° C. are desirable in some embodiments. The choice of corresponding ligand will sometimes impact the decomposition temperature. Lewis base ligands that may be used with palladium carboxylates and allow decomposition in the above temperature range include cyclopentylamine, triethyl amine, diisopropyl amine, etc. Palladium proprionate has a decomposition temperature of about 130° C. (oven temperature) when used with triethylamine as a Lewis base ligand.

As mentioned, a Lewis base ligand may be provided in the palladium precursor solution to facilitate formation of active palladium. As alluded to above, it is believed that the presence of a Lewis base interferes with the natural tendency of palladium carboxylate molecules to bridge with one another in solution. Therefore, in certain embodiments, a strong Lewis base is provided to the palladium precursor solution to coordinate with available spaces on a palladium that are not occupied by carboxylate groups. In the embodiments described here, the Lewis base acts as a ligand for the palladium compounds. In a simplistic view of the chemistry, palladium has four separate coordination sites that may be occupied. In palladium carboxylates, carboxylic acid moieties occupy two of these sites (because palladium has a valence of two). The remaining two sites may be occupied by other palladium molecules, by complexing groups, etc. In the embodiments described here, the Lewis base ligand may occupy one or two available sites on the palladium and sterically hinder access to those sites by other palladium carboxylate molecules, etc. Thus, introducing these ligands may minimize bridging between individual palladium carboxylate molecules and facilitate deposition of the palladium atoms on the substrate in an isolated fashion. Again, this is believed to provide better adhesion of the elemental palladium to the underlying substrate and better shelf life to the palladium ink.

The Lewis base ligands may be any material that meets the various constraints for an application (e.g., for use with a specific ink jet printer) and interferes with solution phase bridging between palladium compounds without decomposing them. Examples include various nitrogen compounds, phosphorous compounds, sulfur compounds, etc. Nitrogen-containing compounds are particularly well-suited to stabilize many palladium precursors such as palladium carboxylates. Examples of nitrogen-containing compounds include nitrogen donors such as primary, secondary and tertiary amines with a general formula $RNH_2$, $R_1R_2NH$, or $R_1R_2R_3N$, whose $R=C_nH2_{n+1}$ and n=1 to 15, ($R_1R_2R_3$ may be similar or dissimilar), etc. The amines may be aliphatic or aromatic, straight chain or branched, and with or without unsaturation. Specific examples include, for example, cyclopentylamine, tri-ethylamine, pyridine carboxylates, pyridine, aniline, tetramethylethylenediamine, dimethylamine, and di-isopropylamine. In certain embodiments, the molecular weight of the Lewis base is between about 30 and 200, more preferably between about 45 and 145. However, in some situations, it may be appropriate to employ larger molecules or even polymers such as polyimines. This may be appropriate when, for example, it is desired to increase the viscosity of the palladium precursor solution.

To produce elemental palladium on the substrate, the Lewis base ligands will, in most embodiments, need to be removed. This can be accomplished by either volatilization (depending on the vapor pressure of the base) or decomposition (along with the palladium precursor). Decomposition of a nitrogen-containing base may produce a fragmented or an unfragmented amine.

In some embodiments, the Lewis base is a polar species and may thus require the use of a polar solvent. In certain embodiments, aqueous solvents may be appropriate; i.e., water may serve as a solvent, in part or in whole.

Other factors may enter choosing a Lewis base. Selection of the Lewis base ligand will also affect shelf life of the palladium precursor solution and thermal stability in palladium precursor after the solvent is evaporated away. For example, cyclopentylamine or diisopropylamine will generally improve shelf life. Thermal stability affects shelf life—and the ease of removing the palladium precursor from the substrate. Thus, the Lewis base ligand should readily volatilize when decomposed and separated from the palladium, but not be subject to degradation within handling temperatures. Smaller molecular-weight ligands, such as pyridine, diisopropyl amine, and cyclopentyl amine are particularly well-suited in this regard. In another embodiment, the Lewis base ligand is selected to give a decomposition temperature for the palladium precursor that is less than the melting temperature of the substrate. Choice of the Lewis base ligand will then depend, in part, on the substrate being used. Diisopropylamine and triethyl amine in a molar ratio of 1:1 is suitable for use with polyester for example.

The Lewis base ligand will also affect rheological properties of the solution. Thus, in certain embodiments, the rheological properties of Lewis base are considered in making a decision on which compound to use. For example, tri-ethanol-amine acts as both a suitable Lewis base and as a surfactant.

The solvent may be selected according to a number of factors. In one embodiment, the solvent is a polar molecule or a combination of polar molecules. In some embodiments, the solvent is aprotic, preferably comprised of one or more polar aprotic compounds. Thus, the solvent may be a) polar or non-polar, b) aprotic or protonic, or any combination of a) and b). The solvent should be chosen so that it does not interfere with the balance between the Lewis base ligand and the palladium precursor compound.

Some suitable solvents include glycol ethers, methanol, amylacetate, gamma-butyrolactone, water, ethylene glycol, di-ethylene glycol, propylene glycol, isobutyl acetate, DMF, tetramethyl urea, toluene hexane, cyclohexanone, terpeneol, 2,2-dimethoxy propane, chloroform, dichloromethane, ethylene carbonate, ethylene glycol, diethylene glycol dimethyl ether, propylene glycol monomethyl ether acetate, butyl acetate, hydrocarbons such as toluene, xylenes, cyclo hexanone, ethylene glycol dimethyl ether, ethylene glycol diethyl ether, iso amyl acetate. A mixture of two or more of these solvents may also be used.

Choice of the solvent may be influenced by the intended process for removing it from the deposition substrate. If evaporation is chosen, the solvent should have a relatively high vapor pressure at the temperature employed to remove the solvent. In addition, heat capacity can affect the choice of a solvent. Note that the evaporation rate strongly influences the speed and spatial accuracy of pattern manufacture as described above. Mixtures of solvents may then be varied to achieve a desired evaporation temperature.

As mentioned above, rheological properties of the solvent may also affect solvent selection. Appropriate rheological properties for solvent selection include density, viscosity, and surface tension. The solvent rheological properties may also be selected relative to a particular substrate being used; liquid and droplet performance on paper is often different than on a plastic material. A mixture of amyl acetate and glycol ethers is well-suited as a solvent for use with polyimid. Choice of solvent rheological properties may also be affected by a printing apparatus or dispensing mechanism in the printing apparatus, e.g., to reduce viscosity for Gravure printing as described above. In addition, since printing resolution is often affected by solvent properties, surface tension for the solvent may be modified in order to increase resolution of a printed pattern.

The palladium ink also may include a solvent that is chosen for a certain combination of the properties listed above (e.g., it may dictate the viscosity, evaporation rate, and surface tension of solution).

The solvent must also be compatible with any components in the printing apparatus used to deliver the palladium ink. For example, seals on many commercially available printers may include an elastomer that corrodes in the presence of certain chemicals. Plasticizers for example, which may be included in the palladium precursor solution 210, are commonly known to corrode plastic materials. Other components in a printing apparatus that may corrode include plastics, ceramics and metal components such as those used in a gasket, O-ring or seal. If the printer is known to have these or other chemical sensitivities, then the solvent may be selected to avoid corrosion of such parts. Suitable non-corrosive solvents include diethylene glycol diethyl ether.

Having described manufacturing processes suitable for use with the present invention, along with suitable chemistry, alternative forms of manufacture suitable for use will now be discussed.

The present invention also enables roll-to-roll and other forms of continuous throughput manufacturing. Continuous throughput manufacturing permits circuit precursors and circuits to be efficiently produced in high-volume, and reduces the cost of individual circuits mass-produced in this manner.

Figure 8:
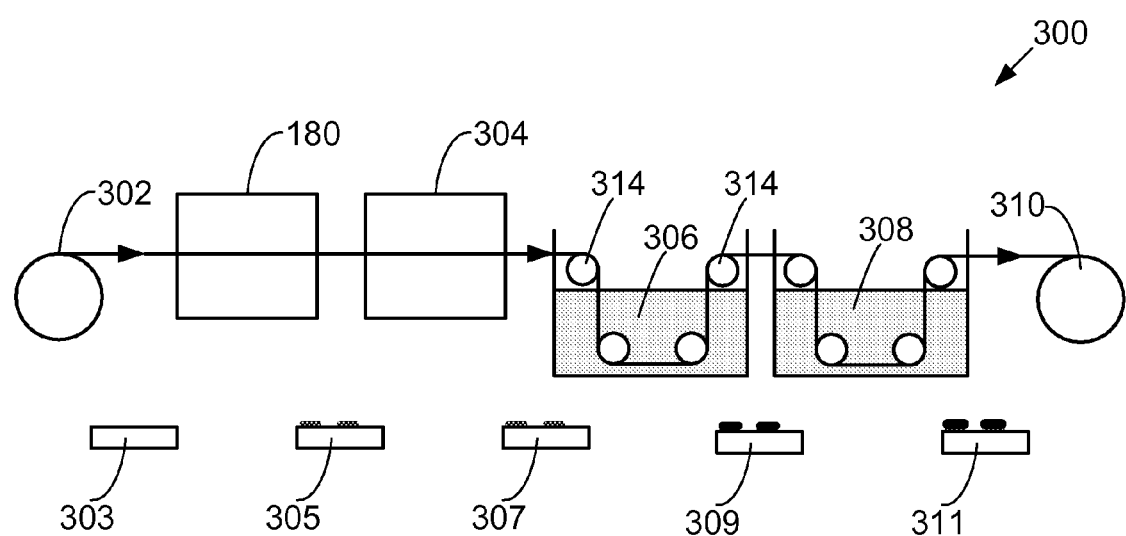
FIG. 8 illustrates a continuous throughput manufacturing process in accordance with one embodiment of the present invention.

FIG. 8 illustrates a continuous throughput manufacturing process 300 in accordance with one embodiment the present invention. FIG. 8 also shows the manufactured product at each manufacturing stage.

Manufacturing process 300 begins with providing a substrate 303 off a roll of substrate material 302. For example, roll 302 may include a roll of thin polyester or polyimid tape.

Each layer from the roll 302 is provided to a printing apparatus 180, which deposits a palladium precursor solution onto the substrate. As one of skill in the manufacturing arts will appreciate, there are numerous techniques suitable for automated supply of a substrate between roll 302 and printing apparatus 180.

Substrate with palladium precursor solution printed thereon (305) is provided to curing oven 304, which evaporates the solvent from the palladium precursor solution. Curing oven 304 also decomposes the palladium precursor to produce elemental and active palladium on the surface of the substrate. Output of curing oven 304 are circuit precursors 307 that include active and elemental palladium on a surface of the substrate in a pattern that resembles a desired pattern for conductive lines to be subsequently added. As mentioned before, the palladium pattern may be established during palladium precursor solution deposition in printing apparatus 180 or during selective decomposition in curing oven 304.

The circuit precursors 307 are then provided, by automated means, to electroless copper deposition station 306. Electroless plating, also known as chemical or auto-catalytic plating, is a non-galvaonic type of plating method that involves several simultaneous reactions in an aqueous solution, which may occur without the use of external electrical power. The reaction is accomplished when hydrogen is released by a reducing agent, such as sodium borohydride, and oxidized thus producing a negative charge on the surface of the part. The most common electroless plating methods are electroless nickel and copper platings, where the chemistry for each may vary significantly. In one embodiment, electroless copper deposition includes submersing a circuit precursor in a solution that includes copper ions, a reducing agent, a buffer to maintain a certain pH and a complexing agent. In general, manufacturing process 300 may use any commercially available electroless deposition technique or apparatus. Metals added via electroless plating include gold, silver, copper, nickel, rhodium, and palladium, for example. The exact chemistry and steps will vary with the type metal.

One suitable electroless copper process consists of four stages: cleaning, activation, acceleration, and deposition. The cleaning stage uses a cleaner-conditioner to remove organics and condition pattern features for the subsequent uptake of a catalyst. The cleaner-conditioners often include an alkaline solution. An optional micro etch step may follow the cleaning; the micro etch processing step can be used in an electroless line, oxide line, pattern plate line, or with chemical cleaning. Activation, through use of a catalyst, reduces the positive ion metal being added. Common activation catalysts include tin chloride, or palladium chloride. Acceleration removes the remaining positive metal ions from the pattern. Fluoboric acid is a common accelerator, as is sulfuric acid with hydrazine.

Electroless copper deposition and baths can be divided into two types: heavy deposition baths (designed to produce 75 to 125 micro-inches of copper) and light deposition baths (20 to 40 micro-inches). Electrolytic copper plating commonly follows light deposition. Heavy deposition can survive the outer layer imaging process, with copper electroplating occurring thereafter. Common constituents of electroless copper chemistry are sodium hydroxide, formaldehyde, EDTA (or other chelater) and a copper salt. In one specific complex reaction, catalyzed by palladium, formaldehyde reduces the copper ion to metallic copper. Formaldehyde (which is oxidized), sodium hydroxide (which is broken down), and copper (which is deposited) must be replenished frequently. Many heavy deposition baths have automatic replenishment schemes based on in-tank colorimeters. Light deposition formulations may be controlled by analysis. An anti-tarnish bath may be used after deposition.

Output of copper deposition station 306 is a circuit 309 with copper disposed over the active and elemental palladium according to the palladium pattern.

The circuits 309 then provided, again by automated means, to electroplating station 308. Electroplating deposits additional metal used in the conductive lines. Electroplating is the process by which a metal in its ionic form is supplied with electrons to form a non-ionic coating on a desired substrate. One common electroplating system involves a chemical solution which contains the ionic form of the metal, an anode (positively charged) which may consist of the metal being plated (a soluble anode) or an insoluble anode (usually carbon, platinum, titanium, lead, or steel), and finally, a cathode (negatively charged) where electrons are supplied to produce a film of non-ionic metal. Electroplating may not be necessary when enough copper or metal has been deposited by electroless deposition station 306, but is commonly used after a light deposition. Electroplating may include a full panel plating, which adds about 1 mil on the surface, or a "flash" panel plating, designed only to add small amounts of copper. Flash-plated panels return to copper electroplating to be plated up to a required thickness.

Output of electroplating station 308 is circuits 311 printed on the substrate 302. In this case, the circuits are provided back to a roll 310 for easy shipping of the individual circuits 311 in a common roll.

Roll-to-roll manufacturing as demonstrated by manufacturing process 300 permits automated manufacture by pulling a common line of polyimid (or another rolled and flexible material) substrate over a number of rollers 314 along the manufacturing process. This reduces substrate handling, increases manufacturing speed and efficiency, facilitates high volume manufacturing, and permits for centralized automated control of each stage in manufacturing process 300.

Figure 9A:
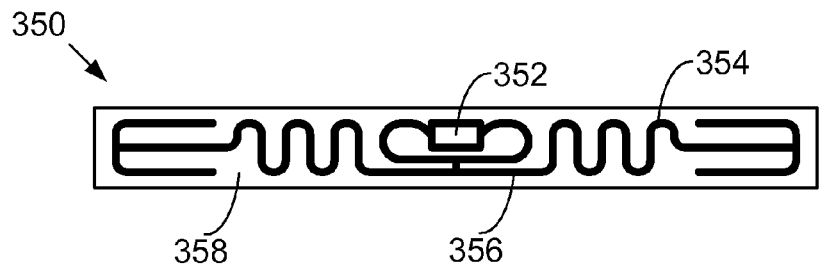
FIG. 9A illustrates an exemplary RFID device in accordance with a specific embodiment of the present invention.
Figure 9B:
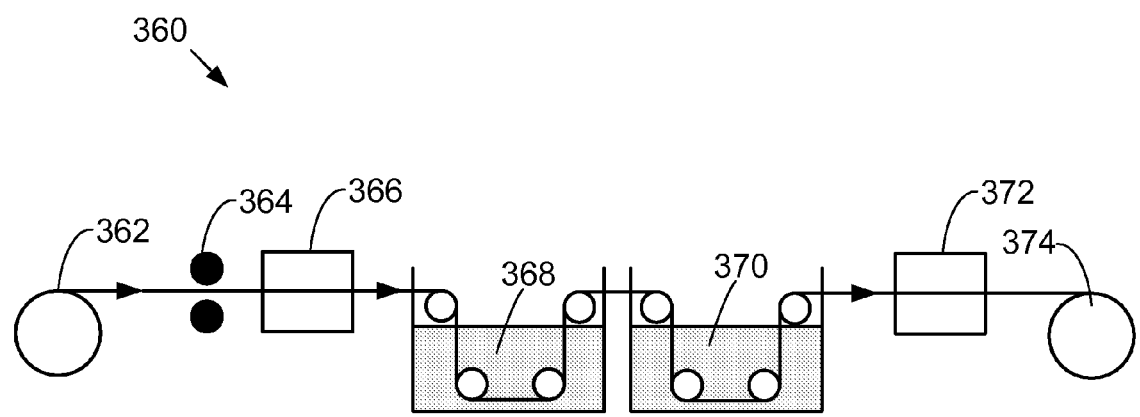
FIG. 9B illustrates the automated manufacturing process of the RFID device of FIG. 9A according to techniques of the present invention.

The present invention is thus well-suited for high throughput manufacture of small circuits. FIGS. 9A and 9B illustrate automated manufacture of RFID devices in accordance with a specific embodiment of the present invention.

FIG. 9A illustrates an exemplary RFID device 350 in accordance with a specific embodiment of the present invention. RFID device (or RFID tag) 350 includes a chip 352 and an antenna 354. Chip 352 may be any commercially available RFID chip, such as those commercially available from a wide variety of vendors such as Motorola. Antenna 354 permits communication between chip 352 and an external RFID reader, and includes a pattern 356 of conductive lines on the surface of a substrate 358.

FIG. 9B illustrates the automated manufacturing process 360 of RFID device 350 according to techniques of the present invention. Manufacturing process 360 begins by rolling a polyester substrate from a spool 362.

The polyester substrate is then continuously fed through a Gravure or other rolled printing apparatus 364 that deposits palladium ink onto one or more surfaces of the polyester substrate. The Gravure printing apparatus 364 operates at high speeds to produce a palladium pattern that resembles the final antenna pattern 356. Since the final RFID device 350 may be quite small and often in the range of a few millimeters or less in size, while the roll for Gravure printing apparatus 364 may be substantially larger and up to a meter in diameter, hundreds or thousands of a palladium antenna patterns (depending on the width of the polyester material supplied to the roll) may be produced for each turn of the roll in printing apparatus 364.

The printed palladium solution patterns on the polyester substrate are then provided to decomposition apparatus 366, which generates active palladium on the surface of the polyester substrate by supplying energy to a) first evaporate the solvent from the solution, and then b) to convert the palladium precursor to active palladium. In this case, decomposition apparatus 366 supplies one of: hot air, ultraviolet energy, or infrared energy to supply energy for both a) and b). For example, an infrared lamp disposed proximate to the substrate as it passes by may be suitable to provide enough energy for both phases of processing.

Copper is then added to the palladium precursor patterns on the substrate (according to the location of the patterns on the substrate) to form the metal antenna 354. As shown, manufacturing process 360 uses both electroless copper deposition 368 and copper electroplating 370, which were described above with respect to FIG. 8.

The automated process then transports the substrate and antenna to an optional die-attach station 372, which adds chip 352 to each RFID device 350. This may use any robotic or automated technology suitable for placing small devices on the polyester substrate.

Figure 9C:
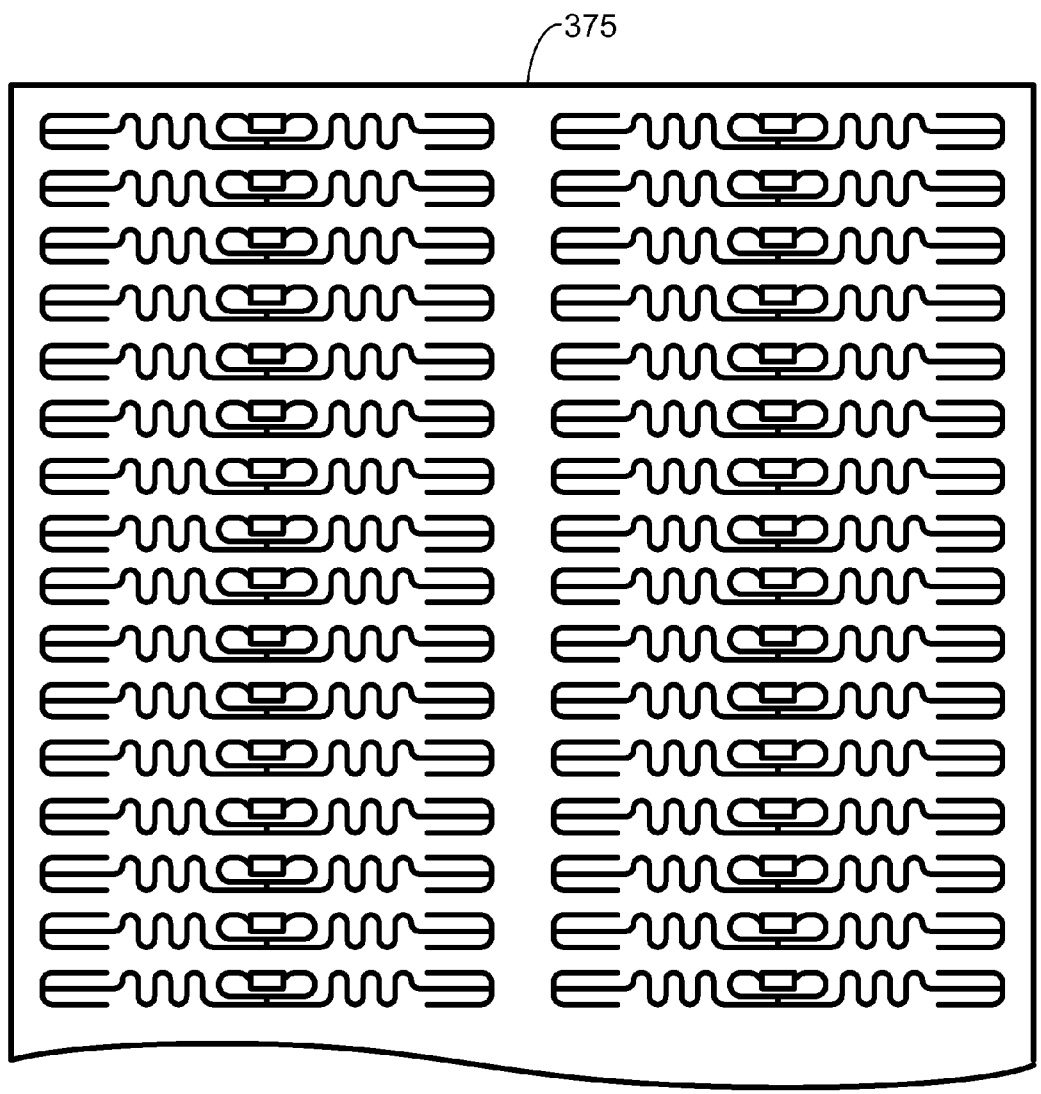
FIG. 9C shows exemplary printed output of the manufacturing process of FIG. 9B, which includes numerous RFID devices on a roll material, in accordance with a specific embodiment of the present invention.

FIG. 9C shows the printed output 375 of manufacturing process 360, which includes numerous RFID devices on the roll material before being cut, in accordance with a specific embodiment of the present invention. As shown, the RFID devices 350 remain on a common polyester substrate and are rolled back onto an RFID device spool 374. In another embodiment, the substrate is cut to produce separated RFID devices that are individually packaged as output of manufacturing process 360.

The present invention finds wide use. Provided now are several additional exemplary products and applications; the following examples are not meant to be exhaustive, and the present invention finds use in other applications not mentioned herein for sake of brevity.

RFID devices as produced above are suitable for use in the following applications: package and parcel tracking, baggage handling systems used in airports, animal tracking on farms, inventory management, libraries, document management, electronic toll systems, car identity, ski tickets, medical goods, anti-counterfeiting of monetary currencies, electronic security surveillance of articles such as clothing goods, access control such as requiring security personnel to carry on RFID device, etc.

Circuits produced according to the present invention find wide application. Specific circuits include placing a palladium layer on electrical contacts, multi-chip modules, printed wiring boards, and PCMCIA (Personal Computer Memory Card International Association) cards. This includes computer chips, packaging for chips, and layered circuit designs are also suitable for production with methods described herein. The present invention also presents an alternative to electroplating and vacuum and adhesive deposition techniques currently used for adding conductive lines, and is applicable in most applications that these conventional fabrication techniques are employed.

As mentioned previously, the present invention is well suited to produce flexible circuits disposed on a flexible substrate. Since the active palladium patterns do not require rigid support of the underlying substrate, circuit precursors produced according to FIG. 1 may be shipped and handled without compromising subsequent copper deposition. The flexible circuits may also remain flexible after copper deposition and conductive line formation.

Figure 10A:
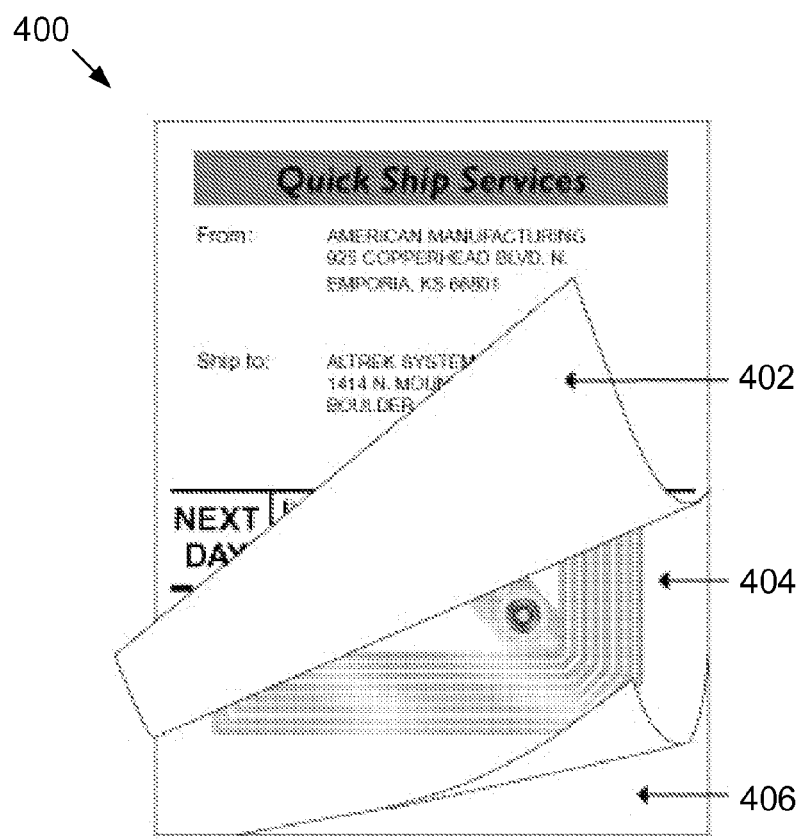
FIG. 10A shows a tracking label that includes a layered design in accordance with a specific embodiment of the present invention.

Flexible conductive circuits made at high throughputs and low cost enables circuit usage in a variety of new and existing applications. FIG. 10A shows a tracking label 400 that includes a layered design in accordance with a specific embodiment of the present invention. The layered design includes an outer layer 402, an intermediate layer 404, and a release layer 406. Outer layer 402 provides visual output for tracking label 400 and may be made from paper or a pressure-sensitive facestock. Intermediate layer 404 includes an RFID antenna and chip that permits wireless communication and tracking of label 400. Intermediate layer 404 may be mass produced according to techniques described herein. Release layer 406 includes a release coated liner, such as those that include a peal-off adhesive. Tracking label 400 is thus well-suited for the shipping industry where large number of packages are sent and tracked on a daily basis. Release layer 406 permits easy of use, while the RFID antenna in intermediate layer 404 permits wireless tracking, which simplifies usage relative to conventional optical tracking technologies that require a shipping employee to manipulate and optical reader within line of sight of the tracking label. Alternatively, the present invention permits an RFID reader to be stored on a truck or delivery vehicle, where the RFID reader automatically and wirelessly logs every package loaded onto the truck and every package subsequently delivered from the truck.

The present invention also enables circuit printing on conformal surfaces. Exemplary conformal surfaces includes those found in cell phones, GPS systems, consumer electronics devices, etc.

Figure 10B:
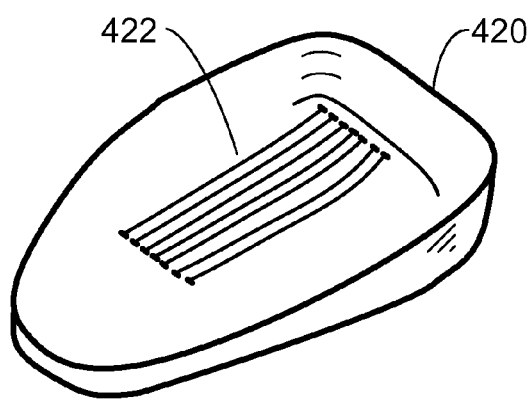
FIG. 10B shows an inner surface of a housing used in a cell phone that includes a conformal surface and circuit printed thereon in accordance with a specific embodiment of the present invention.

FIG. 10B shows an inner surface of a housing 420 used in a cell phone that includes a conformal surface and circuit 422 printed thereon in accordance with a specific embodiment of the present invention. Disposing circuit 422 on housing permits the cell phone to include one less structure dedicated specifically to a circuit. This reduces volume of the cell phone, and may lead to even thinner cell phone profiles.

The present invention also permits metal deposition onto non-circuit structures. For example, circuit components, such as antennae, may be made using techniques described herein. The substrate may include a fiber. These (and other non-metal coated fibers) may be used to create a woven structure or fibrous material. In one embodiment, patterns are not disposed on individual fibers, however, patterns may be created by weaving in a process that optionally employs both coated and uncoated fibers. As mentioned above, oddly shaped substrates may be field coated, such as brushes and their individual bristles, sponges, hook and loop fasteners, etc.

Although the foregoing invention has been described in some detail for purposes of clarity of understanding, it will be apparent that certain changes and modifications may be practiced within the scope of the appended claims. Therefore, the present examples are to be considered as illustrative and not restrictive, and the invention is not to be limited to the details given herein, but may be modified within the scope of the appended claims.

What is claimed is:

1. A method for producing active palladium on a substrate, the method comprising:
    depositing a palladium precursor solution onto the substrate, wherein the palladium precursor solution includes at least palladium propionate, amyl acetate and cyclopentylamine;
    exposing the palladium precursor solution to conditions that promote evaporation of solvent from the palladium precursor solution to leave a palladium precursor on the substrate; and
    decomposing the palladium precursor on the substrate to produce a pattern of active palladium, wherein the active palladium is monatomically disposed on the substrate in the form of single isolated atoms.

2. The method of claim 1 wherein the active palladium does not form a conductive layer on the substrate.

3. The method of claim 2 wherein the active palladium has a surface concentration of less than about $6 \times 10^{-10}$ gram atoms of palladium per square millimeter.

4. The method of claim 1 wherein depositing the palladium precursor solution onto the substrate includes patterning the palladium precursor solution to substantially define an active palladium pattern.

5. The method of claim 4 wherein the palladium precursor solution is deposited onto the substrate using a printing process that permits spatial printing control in response to a signal.

6. The method of claim 1 wherein the active palladium is patterned on the surface of the substrate when the palladium precursor is decomposed to leave active palladium on the substrate.

7. The method of claim 6 wherein decomposing the palladium precursor includes scribing the palladium precursor to produce the active palladium pattern on the substrate.

8. The method of claim 7 wherein the scribing uses one of a laser, an ion beam and an e-beam to decompose the palladium precursor at desired locations according to the active palladium pattern.

9. The method of claim 1 wherein decomposing the palladium precursor includes transferring heat to the substrate.

10. The method of claim 1 wherein decomposing the palladium precursor includes transferring electromagnetic radiation to the substrate or the palladium precursor.

11. The method of claim 1 wherein by-products produced by decomposing the palladium precursor are not reactive with the substrate.

12. The method of claim 1 wherein the substrate is flexible.

13. The method of claim 12 wherein the substrate has an elastic modulus less than about 1 GPa.

14. The method of claim 12 wherein the substrate has a thickness less than about 2 millimeters.

* * * * *